United States Patent
Suzuki

(10) Patent No.: US 7,207,663 B2
(45) Date of Patent: Apr. 24, 2007

(54) FLEXIBLE CIRCUIT SHEET, CONTINUOUS TAPE, AND INK JET HEAD

(75) Inventor: Shigeru Suzuki, Nagoya (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 0 days.

(21) Appl. No.: 11/320,128

(22) Filed: Dec. 27, 2005

(65) Prior Publication Data
US 2006/0141864 A1    Jun. 29, 2006

(30) Foreign Application Priority Data
Dec. 28, 2004   (JP)   .............. 2004-380188

(51) Int. Cl.
B41J 2/045   (2006.01)
B41J 2/14    (2006.01)
(52) U.S. Cl. .......................... 347/68; 347/50
(58) Field of Classification Search .......... 347/50, 347/58, 68
See application file for complete search history.

(56) References Cited
U.S. PATENT DOCUMENTS
6,604,815 B2 *   8/2003   Chen et al. .................. 347/50
7,055,936 B2 *   6/2006   Imai et al. .................... 347/58

FOREIGN PATENT DOCUMENTS
JP   2002-178515   6/2002
JP   2002-36568    2/2005

* cited by examiner

Primary Examiner—An H. Do
(74) Attorney, Agent, or Firm—Reed Smith LLP

(57) ABSTRACT

A flexible circuit sheet is electrically connected to an electric device. The electric device has a first row of electric terminals and a second row of electric terminals. Both the first row of electric terminals and the second row of electric terminals extend along a first direction, the second row of electric terminals extends parallel to the first row of electric terminals. The flexible circuit comprises a base sheet, a first row of lands formed on the base sheet to be electrically connected to the first row of electric terminals, and a second row of lands formed on the base sheet to be electrically connected to the second row of electric terminals. A positional relationship between the first row of lands and the second row of lands is equal to a positional relationship between the first row of electric terminals and the second row of electric terminals. A surface area of each land of the first row of lands is greater than a surface area of each land of the second row of lands.

11 Claims, 14 Drawing Sheets

FLEXIBLE CIRCUIT SHEET, CONTINUOUS TAPE, AND INK JET HEAD

CROSS REFERENCE TO RELATED APPLICATION

This application claims priority to Japanese Patent Application No. 2004-380188 filed on Dec. 28, 2004, the contents of which are hereby incorporated by reference into the present application.

BACKGROUND OF THE INVENTION

1. Field of the Invention

The present invention relates to a flexible circuit sheet that will be connected to an electric device. The present invention also relates to a continuous tape having a plurality of flexible circuit sheets thereon. The present invention further relates to an ink jet head that uses the flexible circuit sheet, and a method of producing the same.

2. Description of the Related Art

An ink jet head of an ink jet printer comprises a passage unit and an actuator unit. The passage unit comprises a plurality of pressure chambers, and a plurality of nozzles. Each pressure chamber communicates with one corresponding nozzle. The actuator unit comprises a plurality of actuators. Each actuator is coupled to one corresponding pressure chamber. The actuator unit selects and actuates one or more actuators from amongst the plurality of actuators. When an actuator is actuated, energy is applied to ink that is stored in the pressure chamber corresponding to that actuator, and ink is jetted from the nozzle corresponding to that pressure chamber. An example of an actuator unit is disclosed in Japan Laid-Open Patent Application Publication 2002-36568.

An actuator is an electric device that uses electrical energy to apply pressure to ink. An actuator unit is a device that is an accumulation of electric devices. Electric wirings must be connected to the actuator unit in order to transmit electrical energy to the actuator unit. Because one or more actuators from amongst the plurality of actuators must be selected and actuated independently, electrical wiring must be connected to each actuator. The number of electric wirings connected to the actuator unit must be equal to or larger than the number of actuators.

A flexible circuit sheet is used in order to connect the electric wirings to the actuator unit. The flexible circuit sheet has a flexible base sheet and electric wirings formed on the base sheet.

An electric terminal is formed on each actuator, and a land is formed on each electric wiring, in order to connect the actuators and the electric wirings. Lands, as used in the present specification, are fixed to the electric terminals, and conduct electricity between the electric wirings and the electric terminals. When the arrangement pattern of the lands formed on the flexible circuit sheet matches the arrangement pattern of the electric terminals formed on the actuator unit, each electric wiring is connected to one corresponding electric terminal by fixing the flexible circuit sheet to the actuator unit. A variety of methods are used in order to fix the electric terminals to the lands. Both may be connected together with solder, both may be fixed together with a conductive adhesive, or both may be welded together.

If one actuator is connected to one electric wiring, the actuator to be actuated can be selected by selecting the electric wiring to which electrical energy will be applied. By selecting the actuators to be actuated, the nozzles that will jet ink can be selected. In addition, by controlling the timing at which electrical energy is applied to the electric wirings, the timing at which ink is jetted from the nozzles can be adjusted.

In the aforementioned, a flexible circuit sheet is connected to the actuator unit, but the electric devices in which a flexible circuit sheet is used are not limited to actuator units. A flexible circuit sheet may be used in a variety of electrical device having a plurality of electric terminals.

In order to mass produce flexible circuit sheets, a continuous tape is used which has a plurality of flexible circuit sheets thereon. When the continuous tape is used, the production efficiency of the flexible circuit sheets will improve.

When the continuous tape is used to mass-produce flexible circuit sheets, a method is used in which solder material is adhered to lands formed on the continuous tape, and then the continuous tape is cut and separated into a plurality of flexible circuit sheets. According to this method, the work efficiency of adhering solder material to the lands formed on the flexible circuit sheet will improve.

The electrical terminals formed on an electric device such as an actuator unit may be grouped into a first row of electric terminals and a second row of electric terminals. The first row of electric terminals extends along a first straight line. The second row of electric terminals extends along a second straight line that is parallel with the first straight line. The direction, in which the first straight line and the second straight line extend, is the first direction in the present specification. The direction that is perpendicular to the first direction is a second direction. The first straight line and the second straight line are separated in the second direction.

The flexible circuit sheet that will be connected to this type of electric device must have a first row of lands that are aligned along the first direction, and a second row of lands that are aligned parallel thereto. The first row of lands and the second row of lands must be separated in the second direction.

When the continuous tape is used to mass-produce the flexible circuit sheets, each flexible circuit sheet including a first row of lands and a second row of lands, the direction in which the continuous tape extends is the second direction, and the width direction of the continuous tape is the first direction. In other words, the first row of lands and the second row of lands will be formed so as to extend in the width direction of the continuous tape. The first row of lands and the second row of lands are separated in the direction in which the continuous tape extends. When this done, a plurality of flexible circuit sheets can be formed on one continuous tape. On one continuous tape, a plurality of flexible circuit sheets are repeated in the second direction.

When the continuous tape is used to mass produce the flexible circuit sheets, as noted above, solder material will be adhered to the lands formed on the continuous tape, and then the continuous tape will be cut. The continuous tape will pass through a solder bath in order to adhere solder material to the lands formed on the continuous tape. Solder material will be adhered to the lands while the continuous tape is passed through the solder bath. The continuous tape will pass through the solder bath by traveling in the second direction (the lengthwise direction of the continuous tape).

When the continuous tape travels in the second direction and passes through the solder bath, the quantity of solder material that will adhere to the forward side of each land in the direction of travel will not be equal to the quantity of solder material that will adhere to the rearward side of each land in the direction of travel. A portion of the solder material adhered to the forward side of each land in the direction of travel will shift to the rearward side of each land in the direction of travel. Because of this, the quantity of solder material that adheres to the forward side of each land in the direction of travel will often be insufficient, and the quantity of solder material that adheres to the rearward side of each land in the direction of travel will often be excessive. To be precise, the quantity of solder per unit of surface area that adheres on the forward side of a land in the direction of travel will often be insufficient, and the quantity of solder per unit of surface area that adheres on the rearward side of a land in the direction of travel will often be excessive.

As noted above, after solder material has been adhered to the first row of lands and the second row of lands, the continuous tape will be cut and separated into a plurality of flexible circuit sheets. By cutting off the end portions of the lands on which solder material has been adhered, a first row of lands and a second row of lands will be formed on both sides of the flexible circuit sheet.

With the first row of lands, if it is assumed that the end portions that will be cut off are on the rearward side in the direction of travel, and the lands that will be effectively used are on the forward side in the direction of travel, then with the second row of lands, the end portions that will be cut off are on the forward side in the direction of travel, and the lands that will be effectively used are on the rearward side in the direction of travel. In this ease, with the first row of lands, the quantity of solder per unit of surface area of the lands will often be insufficient. On the other hand, with the second row of lands, the quantity of solder per unit of surface area of the lands will often be excessive.

When the quantity of solder is insufficient on the first row of lands and the quantity of solder is excessive on the second row of lands, the solder joint between the first row of lands and the first row of electric terminals will not be homogeneous with the solder joint between the second row of lands and the second row of electric terminals, and thus the solder joints will often be poor.

Test electric terminals are often formed on a flexible circuit sheet. In this case, each test electric terminal is formed in a position that is continuous with one corresponding land. The test electric terminals are employed in order to test whether electric signals will be correctly transmitted to each land on the flexible circuit sheet.

When test electric terminals are formed on a flexible circuit sheet, there will be, along the direction of travel of the continuous tape, a group of lands in which lands are positioned on the forward side in the direction of travel and test electric terminals are positioned on the rearward side in the direction of travel, and a group of lands in which the test electric terminals are positioned on the forward side in the direction of travel and the lands are positioned on the rearward side in the direction of travel. With the former group of lands, the quantity of solder adhered to each land will be insufficient, because solder flows from the lands on the forward side in the direction of travel to the test electric terminals on the rearward side in the direction of travel. With the latter group of lands, the quantity of solder adhered to each land will be excessive, because after solder flows from the electric terminals on the forward side in the direction of travel to the lands on the rearward side in the direction of travel. When the test electric terminals are formed, the difference in the quantity of solder adhered to the lands on the forward side of the direction of travel and the quantity of solder adhered to the lands on the rearward side in the direction of travel will be even greater.

The electrical terminals formed on an electric device such as an actuator unit may be grouped into a first row of electric terminals and a second row of electric terminals. The first row of electric terminals extends along a first straight line. The second row of electric terminals extends along a second straight line that is parallel with the first straight line. The direction, in which the first straight line and the second straight line extend, is the first direction in the present specification. The direction that is perpendicular to the first direction is a second direction. The first straight line and the second straight line are separated in the second direction.

BRIEF SUMMARY OF THE INVENTION

The present invention provides technology that can reduce the difference between the quantity of electrically conductive material (such as solder material) adhered to lands on the forward side in the direction of travel, and the quantity of electrically conductive material adhered to lands on the rearward side in the direction of travel, in situations in which a continuous tape that is continuously formed with a plurality of flexible circuit sheets is advanced in order to be adhered to electrically conductive material.

The present invention provides technology that reduces variations in the quantity of electrically conductive material adhered to each land, and reliably electrically connects any of the lands to corresponding electric terminal.

A flexible circuit sheet of the invention is electrically connected to an electric device. The electric device has a first row of electric terminals and a second row of electric terminals. Both the first row of electric terminals and the second row of electric terminals extend along a first direction. That is, the second row of electric terminals extends parallel TO the first row of electric terminals. The flexible circuit sheet of the invention comprises a base sheet, a first row of lands formed on the base sheet to be electrically connected to the first row of electric terminals, and a second row of lands formed on the base sheet to be electrically connected to the second row of electric terminals. A positional relationship between the first row of lands and the second row of lands is equal to a positional relationship between the first row of electric terminals and the second row of electric terminals. A surface area of each land of the first row of lands is greater than a surface area of each land of the second row of lands.

As noted above, differences between the quantity of electrically conductive material adhered to lands on the forward side in the direction of travel, and the quantity of electrically conductive material adhered to lands on the rearward side in the direction of travel, will occur when a continuous tape that is continuously formed with a plurality of flexible circuit sheets is advanced in order to be adhered to electrically conductive material. With the flexible circuit sheet of the present invention, the surface area of the lands is adjusted in order to reduce the difference between the quantity of electrically conductive material adhered thereto. With the lands in which the quantity of electrically conductive material adhered thereto per unit of surface area is small (the lands here referring to the lands that belong to the first row of lands of the present invention), the surface area of each land will be increased. This will eliminate the problem in which there is an insufficient quantity of electrically conductive material adhered to the lands belonging to the first row of lands. With the lands in which the quantity of electrically conductive material adhered thereto per unit of surface area is large (the lands here referring to the lands that belong to the second row of lands of the present invention), the surface area of each land will be reduced. This will eliminate the problem in which there is an excessive quantity of electrically conductive material adhered to the lands belonging to the second row of lands. The difference in the quantity of electrically conductive material adhered to the first row of lands and the second row of lands can be reduced. The first row of electric terminals and the second row of electric terminals can be electrically connected to the first row of lands and the second row of lands with a suitable quantity of adhered electrically conductive material.

The present invention also teaches a continuous tape. The continuous tape has a plurality of flexible circuit sheets to be electrically connected to a plurality of electric devices. Each electric device has a first row of electric terminals extending in a first direction and a second row of electric terminals extending parallel to the first row of electric terminals. One flexible circuit sheet is connected to a next flexible circuit sheet along a second direction that is perpendicular to the first direction.

Each flexible circuit sheet has a base sheet, a first row of lands formed on the base sheet to be electrically connected to the first row of electric terminals, and a second row of lands formed on the base sheet to be electrically connected to the second row of electric terminals. The first row of lands and the second row of lands extends in the first direction. A surface area of each land of the first row of lands is greater than a surface area of each land of the second row of lands.

When the continuous tape is used, a plurality of flexible circuit sheets can be produced at once. The production efficiency of the flexible circuit sheets can be increased, and the production cost of the flexible circuit sheets can be reduced.

With the first row of lands, if it is assumed that the end portions that will be cut off are on the rearward side in the direction of travel, and the lands that will be effectively used are on the forward side in the direction of travel, then with the second row of lands, the end portions that will be cut off are on the forward side in the direction of travel, and the lands that will be effectively used are on the rearward side in the direction of travel. In this case, with the first row of lands, the quantity of solder per unit of surface area of the lands will often be insufficient. On the other hand, with the second row of lands, the quantity of solder per unit of surface area of the lands will often be excessive.

With the aforementioned ink jet head, the difference between the quantity of electrically conductive material that connects each land belonging to the first row of lands and each electric terminal belonging to the first row of electric terminals, and the quantity of electrically conductive material that connects each land belonging to the second row of lands and each electric terminal belonging to the second row of electric terminals, can be reduced. Each land and each electric terminal can be connected with a suitable quantity of electrically conductive material. An ink jet head whose capabilities are stable, and which has a high degree of reliability, can be achieved.

The present invention also teaches a method of producing an ink jet head. The ink jet head has an actuator unit having a plurality of electric terminals classified into the first row of electric terminals extending in the first direction and the second row of electric terminals separated from the fist row of electric terminals in the second direction. The ink jet head also has a flexible circuit sheet electrically connected to the actuator unit. The flexible circuit sheet is provided with the first row of lands electrically connected to the first row of electric terminals and the second row of lands electrically connected to the second row of electric terminals.

The method of manufacturing the above ink jet head has a step of producing a continuous tape extending in the second direction. The continuous tape is provided with a plurality of the flexible circuit sheets. One flexible circuit sheet is connected to a next flexible circuit sheet along the second direction. Each flexible circuit sheet has the first row of lands to be electrically connected to the first row of electric terminals and the second row of lands to be electrically connected to the second row of electric terminals. The fist row of lands and the second row of lands extend in the first direction. A surface area of each land of the first row of lands is greater tan a surface area of each land of the second row of lands. The method of manufacturing the ink jet head also has a step of adhering electrically conductive material to each land by moving the continuous tape along the second direction across a bath that contains fluid of electrically conductive material. The second row of lands contacts the bath that contains fluid of electrically conductive material earlier than the first row of lands. The method of manufacturing the ink jet head further has a step of cutting the continuous tape into the plurality of independent flexible circuit sheets, and attaching the first row of lands to the first row of electric terminals and attaching the second row of lands to the second row of electric terminals.

The aforementioned production method will solve the problem in which the quantity of electrically conductive material adhered to the lands belonging to the first row of lands is insufficient, and the quantity of electrically conductive material adhered to the lands belonging to the second row of lands is excessive. The first row of electric terminals and the second row of electric terminals can be electrically connected to the first row of lands and the second row of lands with a suitable quantity of adhered electrically conductive material.

The present invention also teaches a method of producing the continuous tape including a plurality of flexible circuit sheets. Each flexible circuit sheet has test terminals. Each test terminal is connected to one corresponding land. A method of producing the ink jet head by using the above continuous tape has a step of forming a first row of test terminals, and forming a second row of test terminals on each flexible circuit sheet. Each test terminal of the first row is connected to one corresponding land of the first row of lands, and each test terminal of the second row is connected to one corresponding land of the second row of lands. The method of producing the ink jet head also has the step of cutting the continuous tape into a plurality of independent flexible circuit sheets. This cutting step has a step of cutting portions between the first row of lands and the first row of the test terminals, and a step of cutting portions between the second row of lands and the second row of the test terminals.

According to the present production method, the test terminals are used to perform a test. A highly reliable flexible circuit sheet can be efficiently produced.

DETAILED DESCRIPTION OF THE INVENTION

Figure 1:
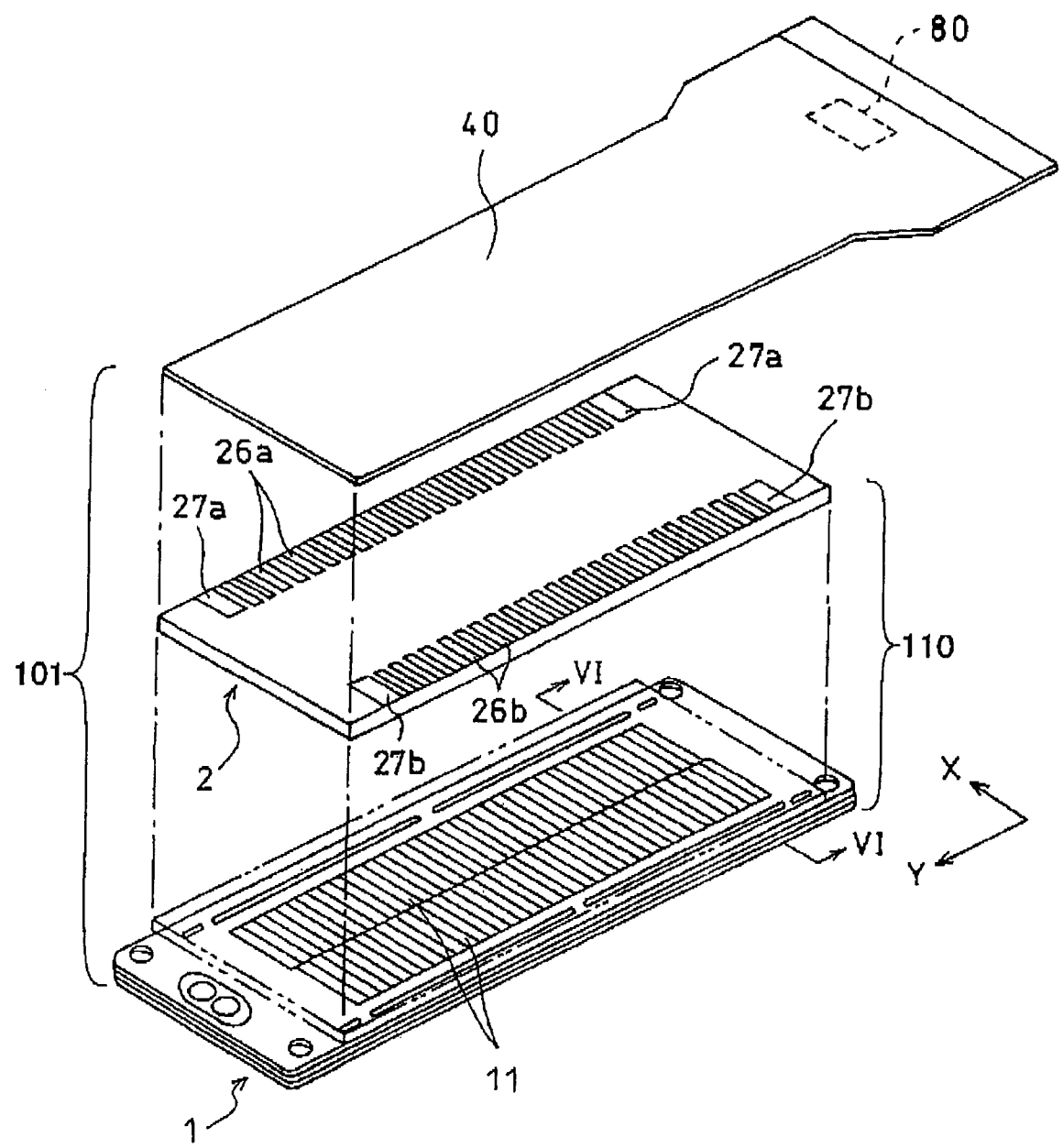
FIG. 1 shows au exploded perspective view of an ink jet head of a first embodiment.

It is preferred that the flexible circuit sheet is provided with a first set of electric wirings formed on the base sheet, and a second set of electric wirings formed on the base sheet. Each land of the first row of lands is connected to one corresponding electric wiring of the first set of electric wirings and each land of the second row of lands is connected to one corresponding electric wiring of the second set of electric wirings.

In this case, a control device can transmit the output electric signals to each land via the corresponding electric wiring. The electric signals transmitted to each land can be independently controlled.

It is also preferred that a number of lands of the first row is equal to a number of lands of the second row.

In this case, the first row of lands and the second row of lands can be easily formed by producing a continuous tape in which each land in the first row of lands and one corresponding land in the second row of lands are continuous, and then cutting the portions in which each land in the first row of lands and the corresponding land in the second row of lands are connected. In addition, when connecting the flexible circuit sheet to an electric device such as an actuator unit or the like, the flexible circuit sheet can be connected with good balance.

Each land of the first row of lands may extend by a first distance along a first direction in which the first and second rows of lands extend, and may extend by a third distance along a second direction which is perpendicular to the first direction. Each land of the second row of lands may extend by a second distance along the first direction, and may extend by a fourth distance along the second direction.

In one preferred aspect, the first distance may be longer than the second distance.

In this case, even if the third distance and the fourth distance are equal, a relationship can be obtained in which the surface area of the land belonging to the first row of lands is larger than the surface area of the land belonging to the second row of lands.

In another preferred aspect, the third distance may be longer than the fourth distance.

In this case, even if the first distance and the second distance are equal, a relationship can be obtained in which the surface area of the land belonging to the first row of lands is larger than the surface area of the land belonging to the second row of lands.

Each land of the first row of lands may have a rectangular shape extending by a first distance along the first direction and extending by a third distance along the second direction. Each land of the second row of lands may have a rectangular shape extending by a second distance along the first direction and extending by a fourth distance along the second direction.

In this case, the shape of each land belonging to the first row of lands and each land belonging to the second row of lands is simplified, and the first row of lands and the second row of lands can be easily formed.

The first distance may be longer than the second distance, and/or the third distance may be longer than the fourth distance.

In this case, a relationship can be easily obtained in which the surface area of the lands belonging to the first row of lands is larger than the surface area of the lands belonging to the second row of lands.

(First Embodiment)

A preferred first embodiment of the present invention will be described with reference to the attached drawings. FIG. 1 shows an exploded view of an ink jet head 101 of an ink jet printer. First, the overall structure of the ink jet head 101 will be described. Note that the portions shown with double dotted lines in the figure are the portions where an actuator unit 2 is provided. X, Y indicate coordinate axes. The ink jet head 101 comprises a head unit 110, and a flexible circuit sheet 40. The head unit 110 has a passage unit 1 and an actuator unit 2 that are stacked together. The flexible circuit sheet 40 comprises a driver IC 80 that drives the actuator unit 2. The flexible circuit sheet 40 is connected to one surface of the actuator unit 2 (the upper surface shown in the figure).

Figure 2:
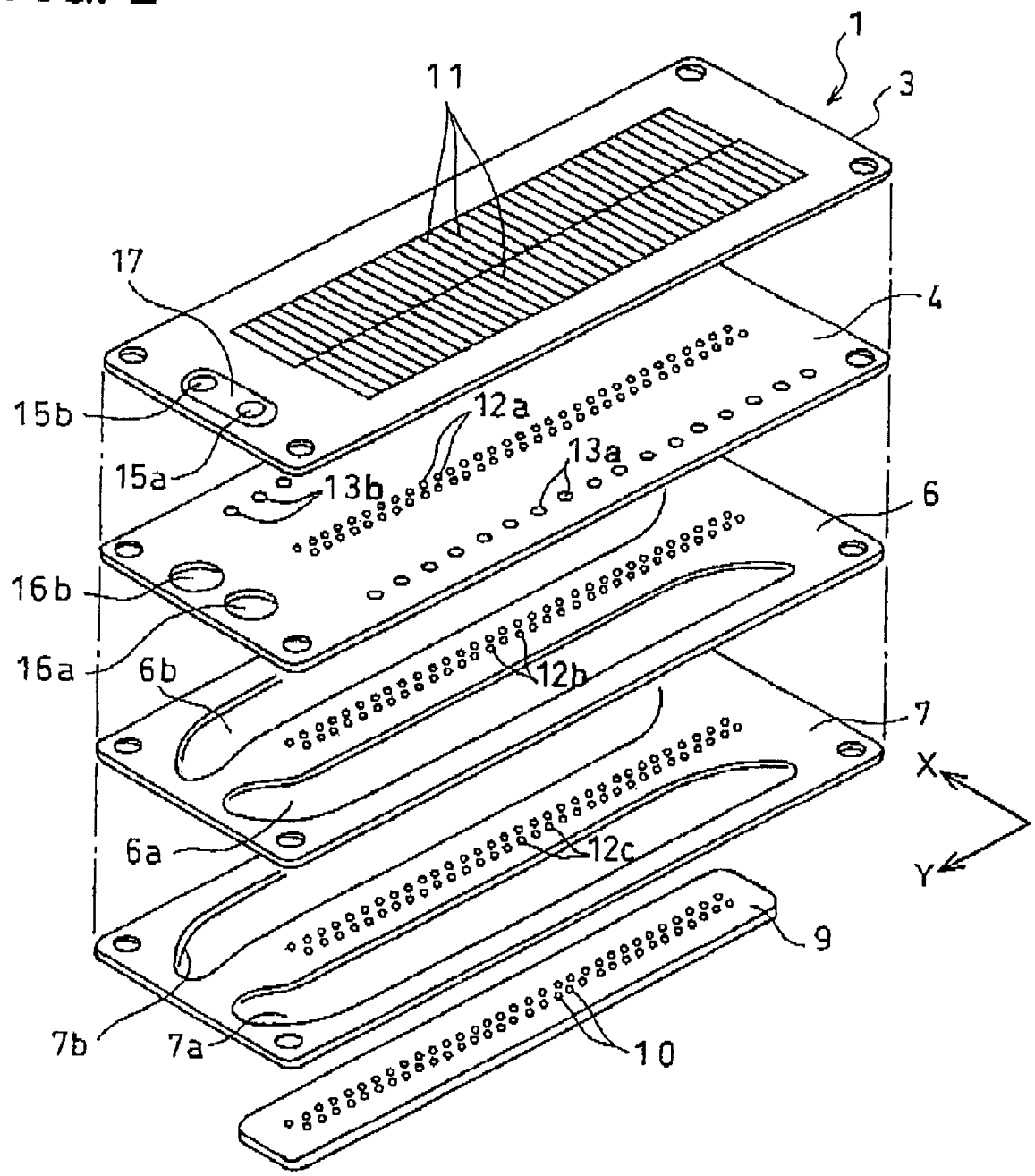
FIG. 2 shows an exploded perspective view of a passage unit of the first embodiment.
Figure 3:
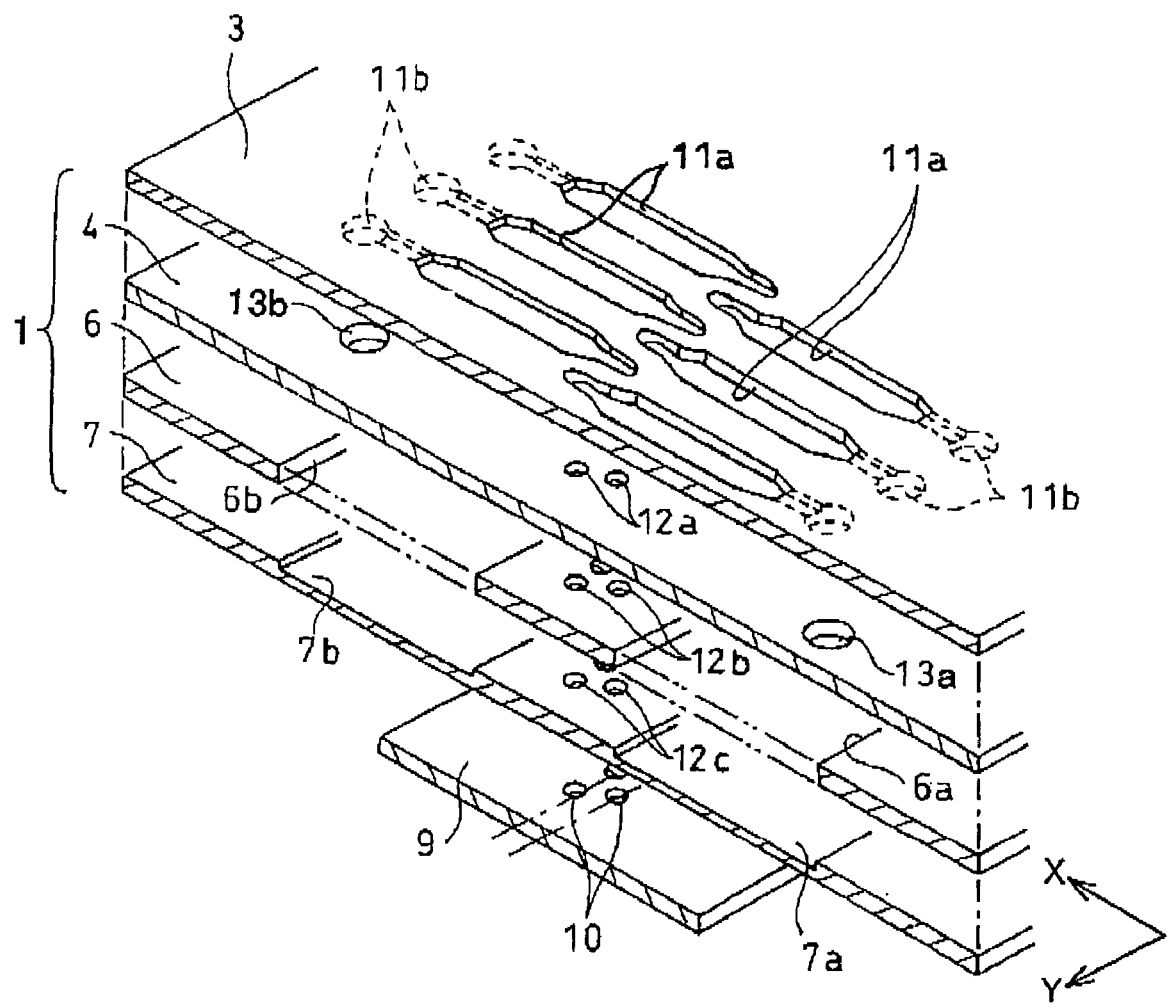
FIG. 3 shows a partial enlarged view of the passage unit of the first embodiment.
Figure 6:
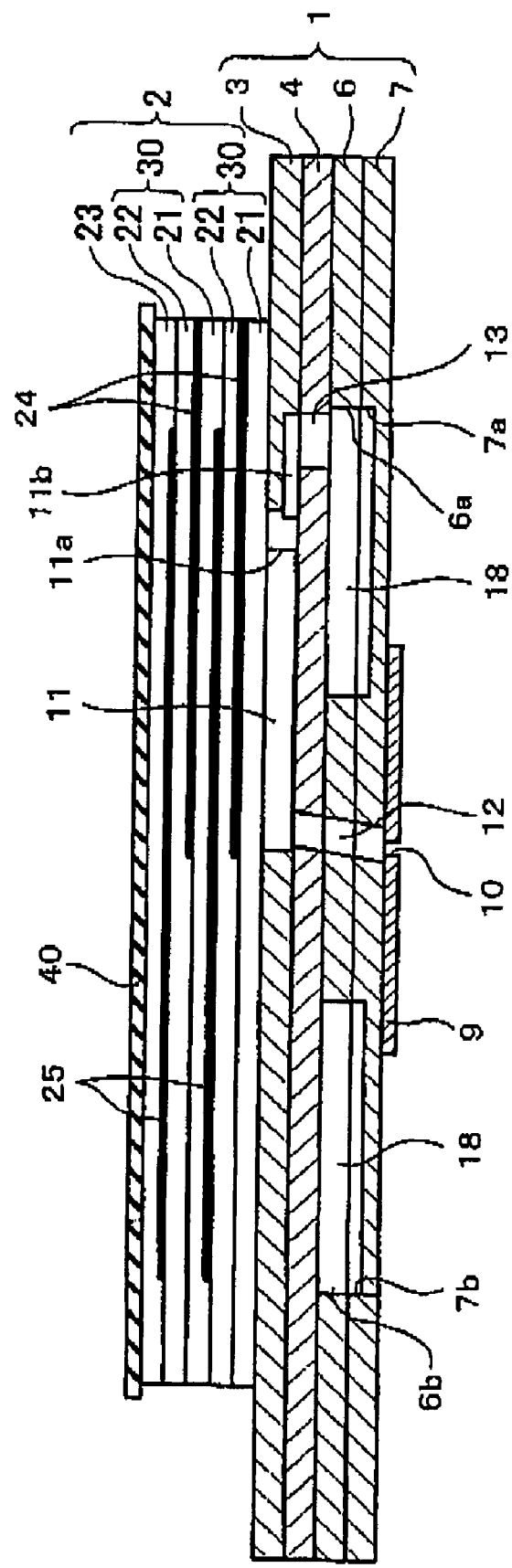
FIG. 6 shows a cross-sectional view of the ink jet head along line VI—VI of FIG. 1.

The passage unit 1 will now be described. FIG. 2 shows an exploded view of the passage unit 1. FIG. 3 shows an enlarged view of the passage unit 1 shown in FIG. 2. FIG. 6 shows a cross-sectional view of the ink jet head 101 taken along line VI—VI shown in FIG. 1. As shown in FIG. 6, the passage unit 1 comprises a manifold passage 18, a pressure chamber 11, an ink passage 12, and a nozzle 10. The manifold passage 18 is an ink chamber, and the ink is supplied from an ink tank not shown in the figures. Ink from the manifold passage 18 passes through the pressure chamber 11 and ink passage 12, and is jetted from the nozzle 10. In addition, the passage unit 1 is formed by stacking a cavity plate 3, a base plate 4, manifold plates 6, 7, and a nozzle plate 9. Each plate 3, 4, 6, 7, 9 is rectangular in shape and 50 to 150 μm in thickness, and each plate is joined with an adhesive.

The cavity plate 3 will now be described. As shown in FIG. 2, the cavity plate 3 has pressure chambers 11, and a recess 17. A large number of pressure chambers 11 are formed in the Y direction of the cavity plate 3, and are aligned in two rows in the X direction. The two rows of pressure chambers 11 in the X direction are slightly shifted in the Y direction. When the pressure chambers 11 are enlarged, as shown in FIG. 3, holes 11a and grooves 11b are formed. The holes 11a form the pressure chambers 11. The grooves 11b are passages that connect the pressure chambers 11 and the manifold passage 18, and the grooves 11b are long and narrow in shape. The grooves 11b increase resistance when ink moves from the manifold passage 18 to the pressure chambers 11. The grooves 11b are formed on the lower side of the cavity plate 3. The recess 17 has a hole 15a and hole 15b. The hole 15a and hole 15b pass through the cavity plate 3. The recess 17 is equipped with a filter, not shown in the figures, that serves to filter the ink.

The base plate 4 will now be described. The base plate 4 has holes 13a, holes 13b, holes 12a, a hole 16a, and a bole 16b. The holes 13a and holes 13b are provided on both ends of the base plate 4 in the X direction, and link with the grooves 11b of the cavity plate 3. The holes 12a are provided in two rows in the center of the base plate 4 in the X direction. The holes 12a are shifted slightly in the Y direction. The holes 12a link with the holes 11a in the cavity plate 3. The hole 16a and hole 16b are arranged on one end of the base plate 4 in the Y direction (the near side in the figure). The hole 16a link with the hole 15a of the cavity plate 3. The hole 16b links with the hole 15b of the cavity plate 3.

The manifold plate 6 will no be described. The manifold plate 6 have a hole 6a, a hole 6b, and holes 12b. The hole 6a and hole 6b are arranged on both sides of the manifold plate 6 in the X direction. The hole 6a links with all of the holes 13a of the base plate 4. The hole 6b links with all of the holes 13b of the base plate 4. The holes 12b are provided in two rows in the center of the manifold plate 6 in the X direction. The holes 12b are shifted slightly in the Y direction. The holes 12b link with the holes 12a in the base plate 4.

The manifold plate 7 will now be described. The manifold plate 7 has a groove 7a, a groove 7b, and holes 12c. The groove 7a and groove 7b are arranged on both sides of the manifold plate 7 in the X direction. The groove 7a links with the hole 6a of the manifold plate 6. The groove 7b links with the bole 6b of the manifold plate 6. The groove 7a and the groove 7b do not pass through the manifold plate 7. The holes 12c are provided in two rows in the center of the manifold plate 7 in the X direction. The holes 12c are shifted slightly in the Y direction. The holes 12c link with the holes 12b in the manifold plate 6.

The nozzle plate 9 will now be described. Nozzle plate 9 has nozzles 10. The nozzles 10 are provided in two rows in the center of the nozzle plate 9 in the X direction. The nozzles 10 are shifted slightly in the Y direction. The nozzles 10 are linked with the holes 12c of the manifold plate 7.

The manifold passage 18 shown in FIG. 6 is formed from the hole 6a and the groove 7a, or the hole 6b and the groove 7b. The ink passage 12 is formed from the holes 12a, the holes 12b, and the holes 12c.

Figure 4:
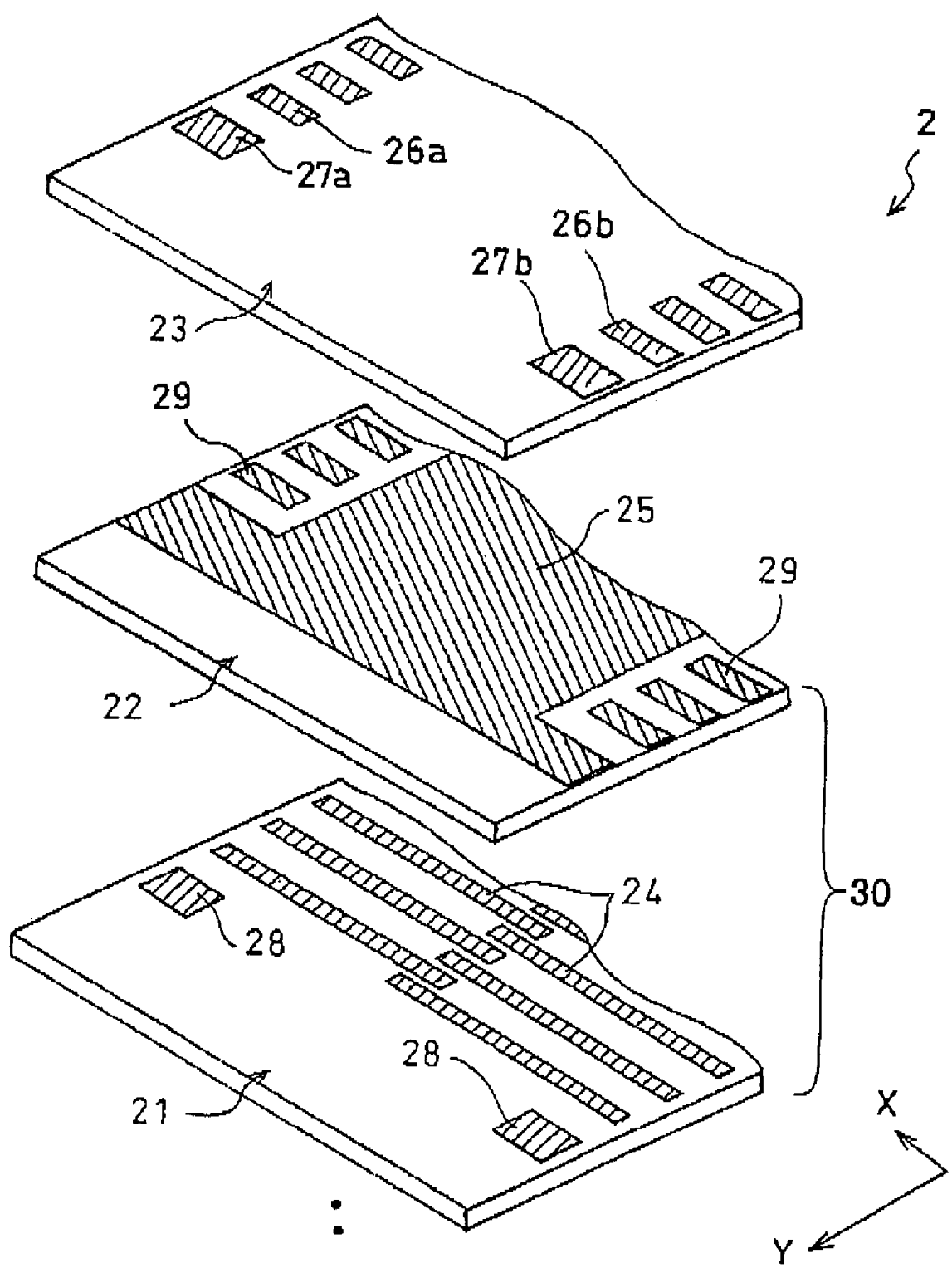
FIG. 4 shows an exploded partial perspective view of an actuator unit of the first embodiment.

The actuator unit 2 will now be described. As shown in FIG. 6, the actuator unit 2 has, sequentially from the bottom, a first type of piezoelectric sheet 21, a second type of piezoelectric sheet 22, the first type of piezoelectric sheet 21, the second type of piezoelectric sheet 22, and atop sheet 23, and are stacked together. FIG. 4 shows an exploded view of the actuator unit 2.

Figure 5:
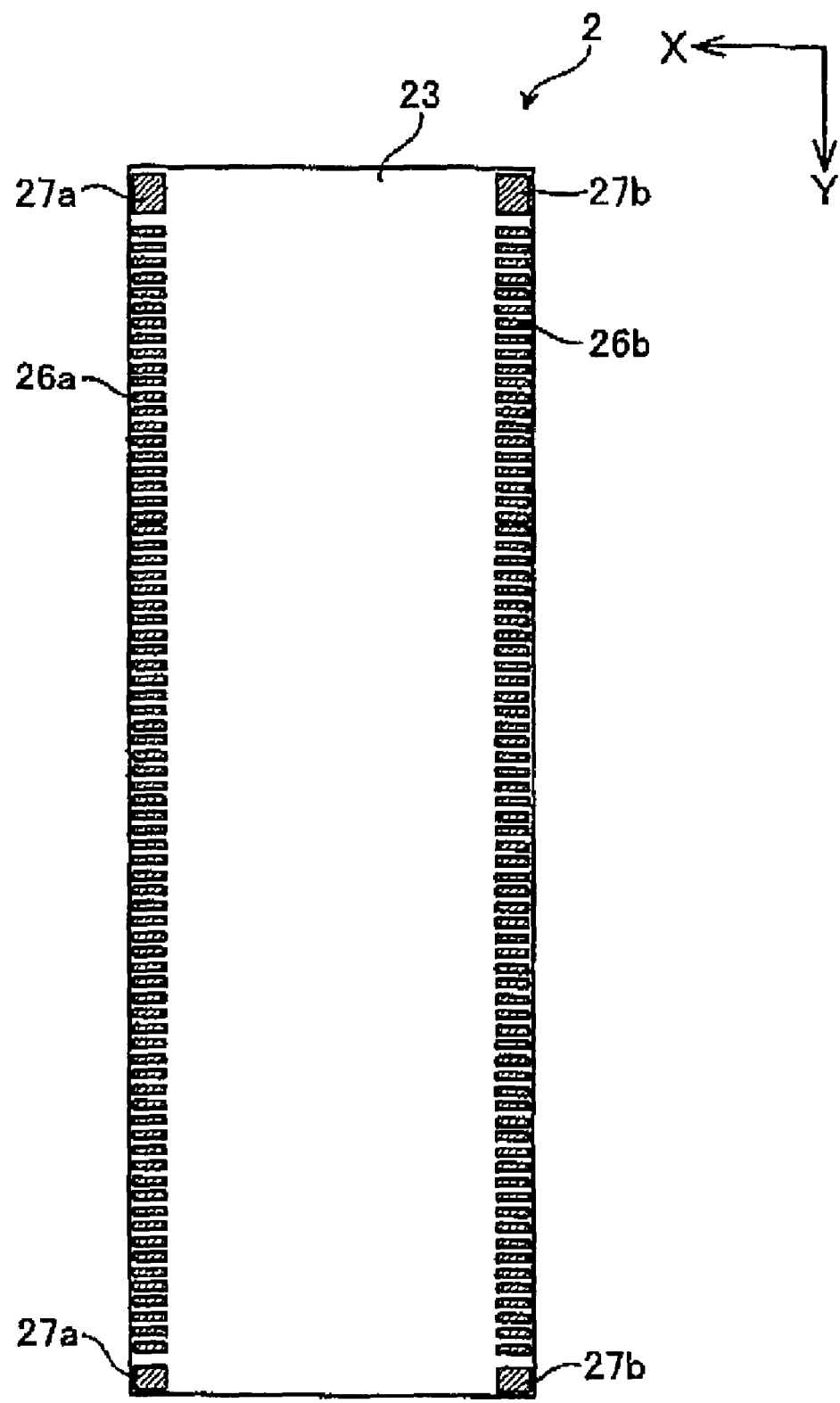
FIG. 5 shows the upper surface of a top sheet of the first embodiment.

The top sheet 23 will now be described. FIG. 5 shows the top sheet 23 from the upper surface thereof The top sheet 23 is a rectangular sheet, and is formed with an insulator material. The top sheet 23 has electric terminals 26a, 26b that input electric signals, and ground electric terminals 27a and 27b. A plurality of electric terminals 26a, 26b are provided on the ends of the top sheet 23 in the X direction. The electric terminals 26a are the same shape as the electric terminals 26b, and are rectangles whose lengths extend in the X direction. Electric signals are supplied from the driver IC 80 to the electric terminals 26a, 26b. The ground electric terminals 27a, 27b are arranged in the corners of the top sheet 23. The ground electric terminals 27a are the same shape as The ground electric terminals 27b. The ground electric terminals 27a are provided on both sides of the electric terminals 26a in the Y direction. The ground electric terminals 27b are provided on both sides of the electric terminals 26b in the Y direction.

The second type of piezoelectric sheet 22 will now be described. The second type of piezoelectric sheet 22 is a rectangular sheet, and is formed with lead zirconium titanate $(Pb(Zr, Ti)O_3)$. The second type of piezoelectric sheet 22 has dummy electrodes 29, and a common electrode 25. The dummy electrodes 29 are provided on the ends of piezoelectric sheet 22 in the X direction at positions corresponding to the electric terminals 26a, 26b of the top sheet 23. The common electrode 25 is provided on substantially the entire surface of the piezoelectric sheet 22. The common electrode 25 is separated from the dummy electrodes 29.

The first type of piezoelectric sheet 21 will now be describe The first type of piezoelectric sheet 21 has individual electrodes 24, and dummy electrodes 28. The individual electrodes 24 extend from the ends in the X direction to near the center in the X direction, and a plurality are provided. Individual electrodes 24 are provided at positions corresponding to the pressure chambers 11 of the passage unit 1. The dummy electrodes 28 are provided in the corners of the piezoelectric sheet 21 at positions corresponding to the ground electric terminals 27a, 27a of the top sheet 23.

The first type of piezoelectric sheet 21, the second type of piezoelectric sheet 22, the first type of piezoelectric sheet 21, the second type of piezoelectric sheet 22, and the top sheet 23 are stacked together, and form the actuator unit 2. The electric terminals 26a, 26b which transmit signals and are positioned on the top sheet 23, the dummy electrodes 29 of the second type of piezoelectric sheet 22, and the individual electrodes 24 of the first type of piezoelectric sheet 21, are electrically connected by through hole electrodes not shown in the figures. The ground electric terminals 27a, 27b of the top sheet 23, the common electrode 25 of the second type of piezoelectric sheet 22, and the dummy electrodes 28 of the first type of piezoelectric sheet 21, are electrically connected by through hole electrodes not shown in the figures.

Figure 7:
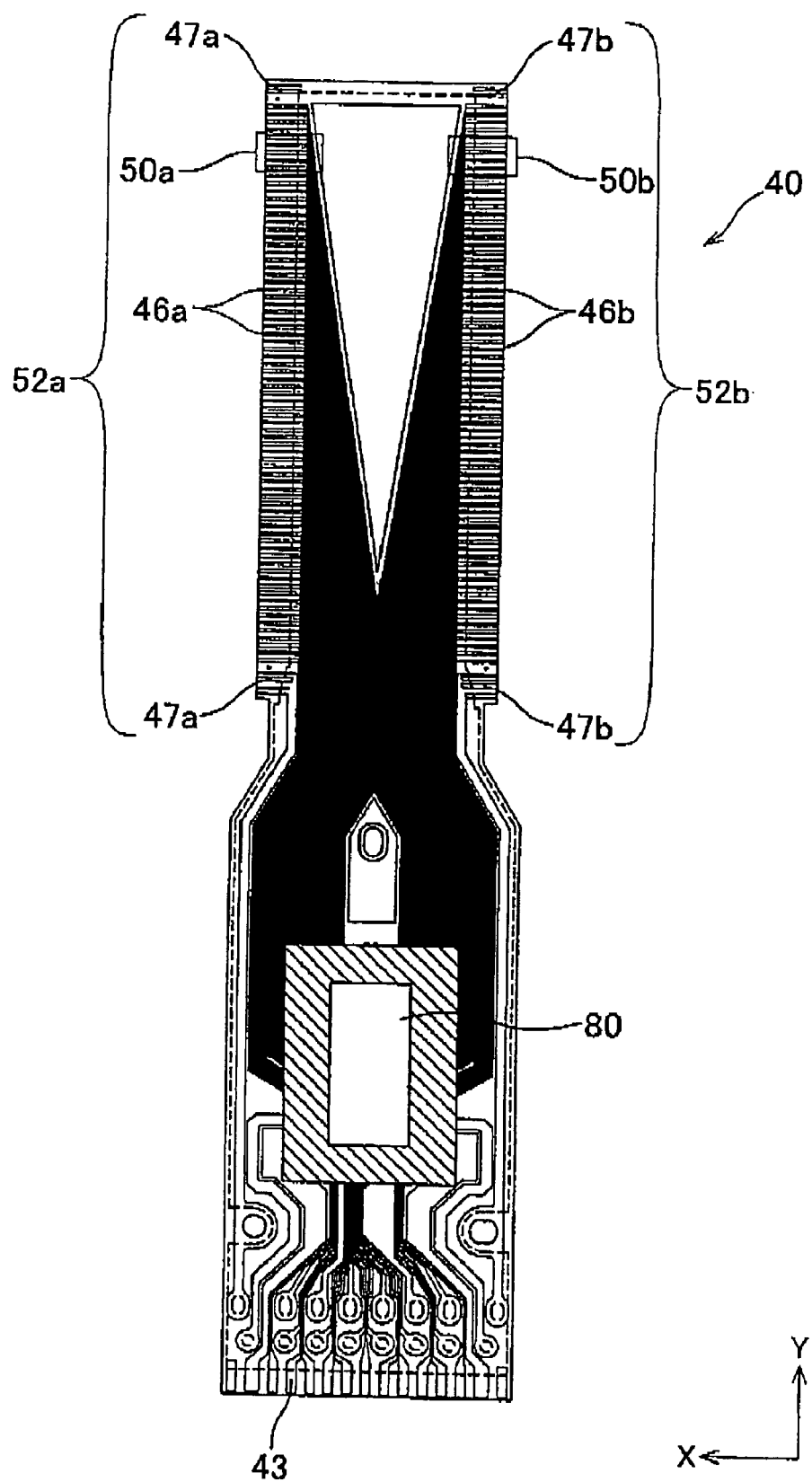
FIG. 7 shows a planar view of a flexible circuit sheet of the first embodiment that is to be joined to the actuator unit.
Figure 8:
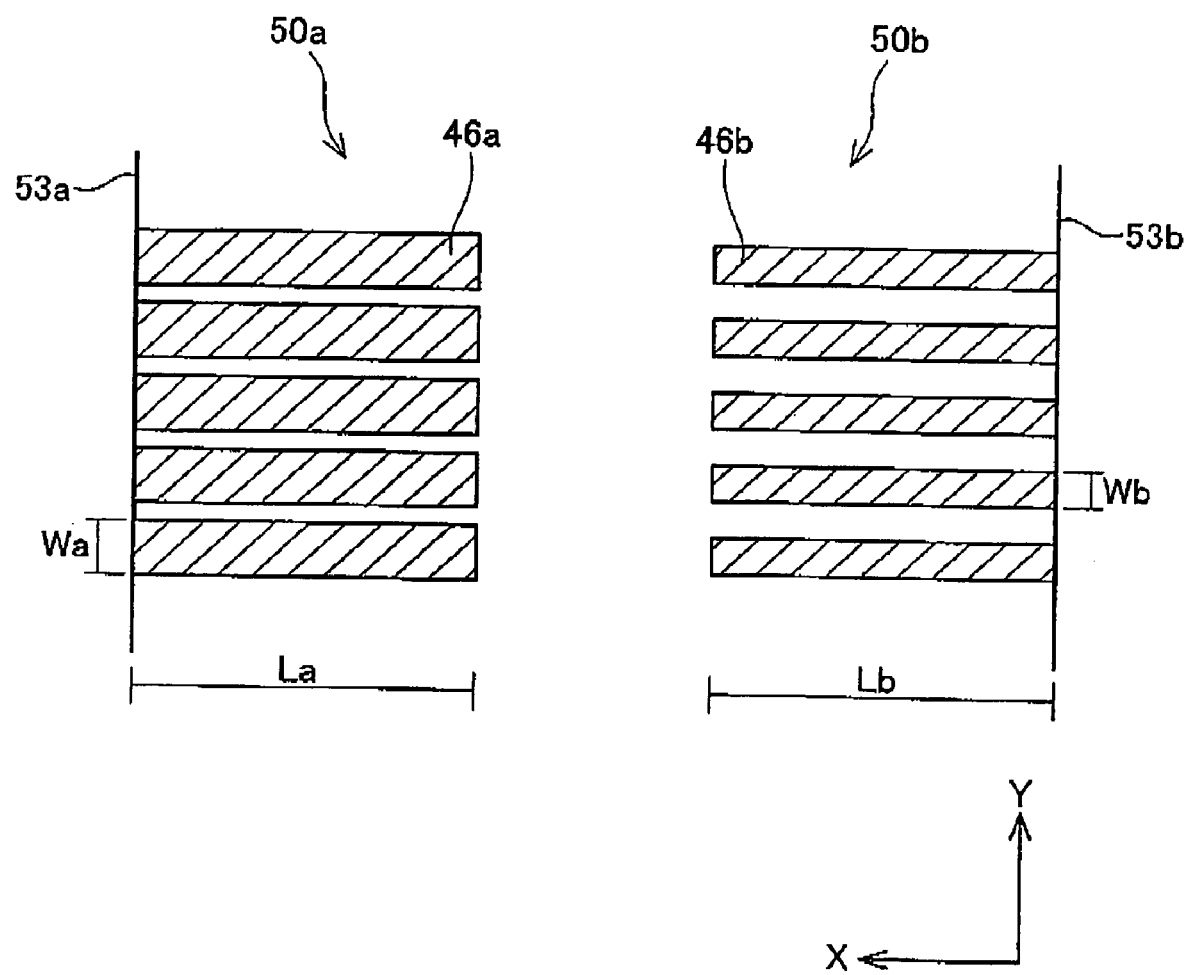
FIG. 8 shows a partial enlarged view of the flexible circuit sheet of FIG. 7.

The flexible circuit sheet 40 will now be described. FIG. 7 shows the surface of the flexible circuit sheet 40 to be joined to the actuator unit 2. FIG. 8 shows an enlarged view of rectangular regions 50a, 50b. The region in FIG. 7 which is colored black indicates a large number of electric wirings that are formed at a high density.

On a polyimide base sheet, the flexible circuit sheet 40 has the driver IC 80, lands 43 for control, lands 46a, 46b, ground lands 47a, 47b, electric wirings that connect the driver IC 80 to the lands 43, and electric wirings that connect the driver IC 80 to the lands 46a, 46b. The driver IC 80 is an element that outputs drive electric signals to the actuator unit 2. The lands 43 for control input electric signals from a control device not shown in the figures, and transmit the inputted electric signals to the driver IC 80 via the electric wirings. A plurality of lands 46a, 46b are formed on approximately the upper half in the Y direction, and are provided on the ends in the X direction The lands 46a, 46b are rectangular in shape, and the lengths thereof extend in the X direction. The lands 46a are connected to the electric terminals 26a of the actuator unit 2, and the lands 46b are connected to the electric terminal 26b of the actuator unit 2. The lands 46a, 46b transmit the drive signals transmitted from the driver IC 80 via the electric wirings, to the electric terminals 26a, 26b of the actuator unit 2. The ground lands 47a are provided on both ends in the X direction of the land 46a, and the ground lands 47b are provided on both ends in the X direction of the lands 46b. The lands 46a and the lands 47a form lands 52a. The lands 46b and the lands 47b form lands 52b.

The lands 52a, 52b will now be described with reference to FIG. 8. The lands 46a and lands 46b are rectangular in shape The length of the lands 46a in the X direction is equal to the length of the lands 46b in the X direction (La=Lb). The length of the lands 46a in the Y direction is longer than the length of the lands 46b in the Y direction (Wa>Wb). As a result, the surface area of the lands 46a is larger than the surface area of the lands 46b.

The operation of the ink jet head 101 will now be described. Electric signals from a control device not shown in the figures are supplied from the control lands 43 to the driver IC 80. The driver IC 80 will supply electric signals from the lands 46a, 46b to the electric terminals 26a, 26b of the actuator unit 2. In the actuator unit 2, electric signals from the electric terminals 26a, 26b will be supplied to electrodes 24. Ground signals will be continually supplied to the common electrode 25 from the ground lands 47a, 47b for, via the ground electric terminals 27a, 27b.

The piezoelectric sheets 21, 22 are polarized in the thickness direction. When electric signals are supplied to the individual electrodes 24, an electric potential will be produced between the individual electrodes 24 and the common electrode 25. The portions of the piezoelectric sheets 21, 22 in which an electric potential is produced will generate an electrical field. The piezoelectric sheets 21, 22 will produce a force that extends in the direction of polarization when an electric field is generated. When the piezoelectric sheets 21, 22 extend in the thickness direction, the volume of the pressure chambers 11 shown in FIG. 6 will be reduced, and the pressure in the pressure chambers 11 will increase. As a result, the ink in the pressure chambers 11 will be jetted from the nozzles 10 via the ink passages 12. When the supply of electric signals to the individual electrodes 24 is stopped, the electric potential between the individual electrodes 24 and the common electrode 25 will equalize. As a result, the thickness of the piezoelectric sheets 21, 22 will return to normal, and the volume of the pressure chambers 11 will return to normal. When the volumes of the pressure chambers 11 return to normal, the pressure in the pressure chambers 11 will decrease, and thus ink will be supplied from the manifold passage 18. This operation will repeat, and an image will be printed on a printing medium.

A method of producing the ink jet 101 will now be described. The ink jet 101 includes a passage unit 1 production step, an actuator unit 2 production step, a flexible circuit sheet 40 production step, and a passage unit 1, actuator unit 2, and flexible circuit sheet 40 joining step.

The passage unit 1 production step will now be described. The passage unit 1 is produced by stacking the cavity plate 3, the base plate 4, the manifold plate 6 and 7, and a nozzle plate 9 together. Each plate is adhered to each other with an adhesive.

The actuator unit 2 production step will now be described. A sheet type thin film will be produced. That film is used in the top sheet 23, the piezoelectric sheet 22, and the piezoelectric sheet 21. A conductive paste is printed on the sheet type thin film in order to produce the electric terminals 26a, 26b, 27a, 27b, and the electrodes 25, 29, 24, 28. The electric terminals 26a, 26b of the top sheet 23, the dummy electrodes 29 of the piezoelectric sheet 22, and the individual electrodes 24 of the piezoelectric sheet 21, are electrically connected by means of the through hole electrode not shown in the figures. The ground electric terminals 27a, 27b of the top sheet 23, the common electrode 25 of the piezoelectric sheet 22, and the dummy electrodes 28 of the piezoelectric sheet 21, are electrically connected by means of the through hole electrode not shown in the figures. After the top sheet 23, the piezoelectric sheet 22, and the piezoelectric sheet 21 are stacked together, the sheet type thin film is sintered.

The steps in the production of the flexible circuit sheet 40 will now be described. The flexible circuit sheet production step includes a continuous tape formation step, an attachment step, a solder material adhering step, a cut off step, and a joining step.

Figure 9:
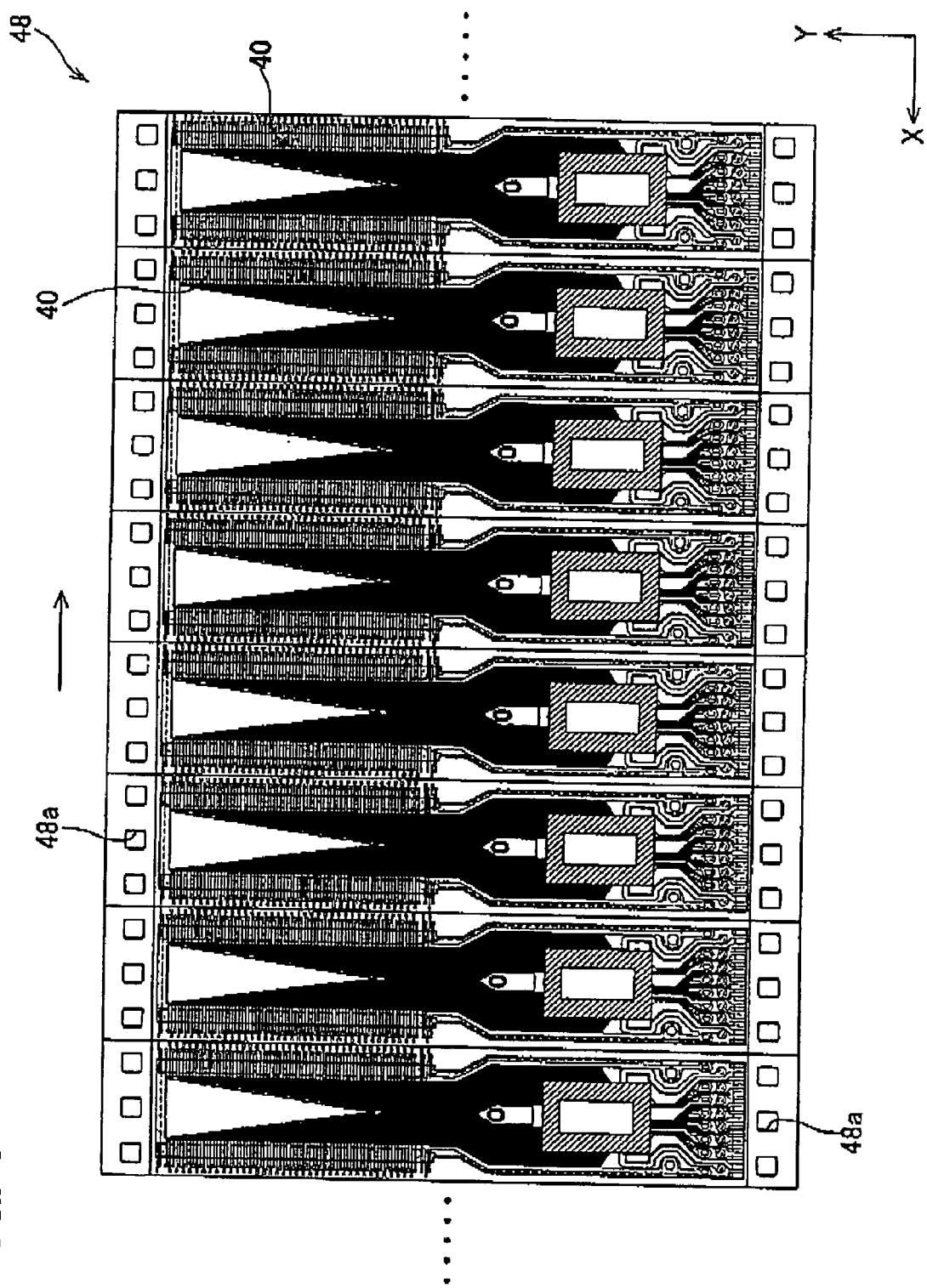
FIG. 9 shows a plan view of a continuous tape on which a plurality of the flexible circuit sheets of FIG. 7 are formed.

The continuous tape formation step will now be described. FIG. 9 shows a continuous tape 48. The continuous tape 48 is a rectangular polyimide film base sheet, and a large number of holes 48a arc formed in the end portions in the Y direction A plurality of flexible circuit sheets 40 are arranged in the continuous tape 48. A conductive pattern that forms electric wirings, the lands 46a, 46b, the lands 47a, 47b, and the lands 43 are printed on the continuous tape 48. A solder resist is printed on top thereof. The lands 46a, 46b are shown in enlarged form in FIG. 11. The lands 46a, 46b are comprised of test lands 45 on the end portions thereof in the X direction. The test lands 45 are sequentially provided in the Y direction, and sequentially shifted in the X direction. In addition, the test lands 45 are rectangular in shape, and are longer in the Y direction than the lands 46a, 46b The attachment step will now be described. In the attachment step, the driver IC 80 will be attached on the flexible circuit sheet 40. After attaching the driver IC 80, the electric signals output from each test land 45 will be confirmed with a test probe not shown in the figures. In this way, it can be confirmed whether the driver IC 80 is attached on the flexible circuit sheet 40. In addition, it can be confirmed that the flexible circuit sheet 40 operates normally.

Figure 10:
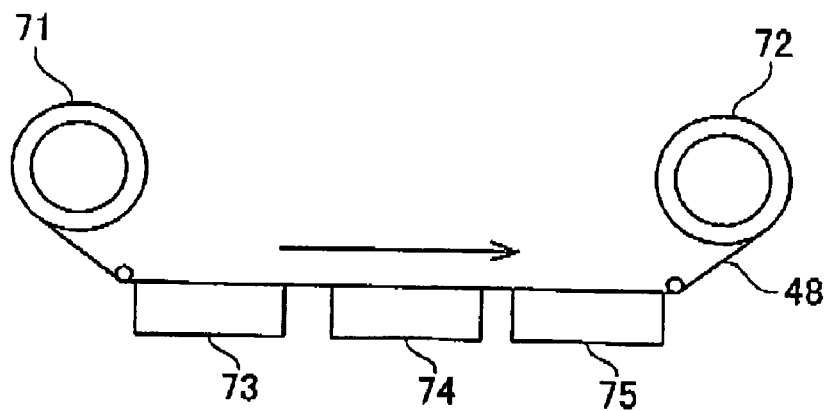
FIG. 10 shows a solder material adhering step that adheres solder material to the continuous tape of FIG. 9.

The solder material adhering step will now be described. In the solder material adhering step, solder will be applied to each land on the flexible circuit sheet 40 of the continuous tape 48. FIG. 10 shows the solder material adhering step. Continuous tape 48 wound onto a roll 71 is unwound onto a roll 72. Solder will be applied to each land during this operation. The continuous tape 48 will continue in the direction of the arrow in FIG. 9. The continuous tape 48 will pass through a flux spray unit 73, a heating unit 74, and a solder bath 75. In the flux spray unit 73, flux will be sprayed on the surface of the continuous tape 48. In the heating unit 74, the surface of the continuous tape 48 will be heated. In the solder bath 75, the continuous tape 48 will be immersed in melted solder. In this case, the lands 52b shown in FIG. 7 will have solder applied thereto before the lands 52a. In other words, in FIG. 1, the lands 46b are positioned on the forward side in the direction of travel, and the lands 46a are positioned on the rearward side in the direction of travel. In the group of lands 46a, the lands 46a are positioned on the forward side in the direction of travel, and the test lands 45 are positioned on the rearward side in the direction of travel. In the group of lands 46b, the test lands 45 are positioned on the forward side in the direction of ravel, and the lands 46b are positioned on the rearward side in the direction of travel. In the former group of lands 46a, the quantity of solder adhered to each land 46a will be insufficient after solder flows from the lands 46a on the forward side in the direction of travel to the test electric terminals 45 on the rearward side in the direction of travel. With the latter group of lands 46b, the quantity of solder adhered to each land 46b will be excessive after solder flows from the test lands 45 on the forward side in the direction of travel to the lands 46b on the rearward side in the direction of travel.

Figure 11:
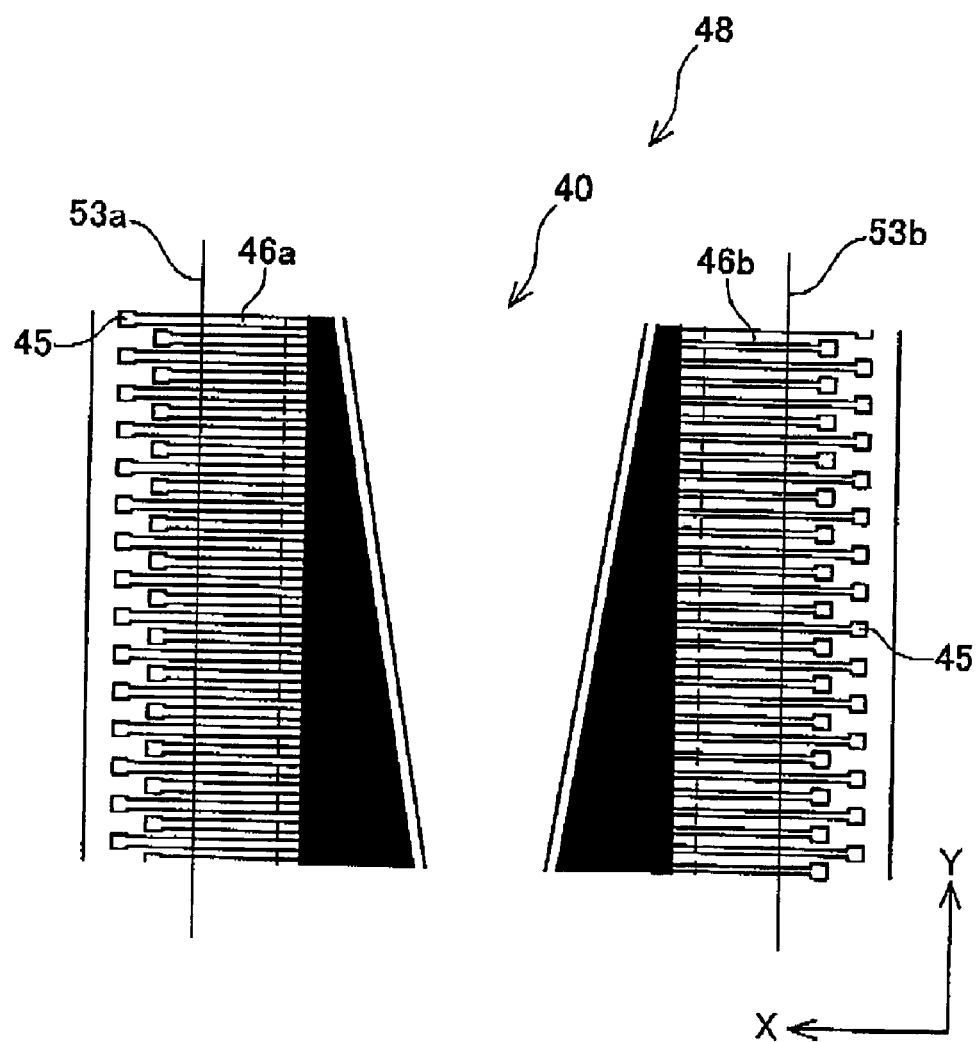
FIG. 11 shows a step of cutting off a plurality of flexible circuit sheets from the continuous tape of FIG. 9.

The cut off step will now be described in the cut off step, the flexible circuit sheet 40 will be cut off from the continuous tape. 53a, 53b of FIG. 11 show the cut off positions of the flexible circuit sheet 40. 53a shows the cut off position of the lands 52a. 53b shows the cut off position of the lands 52b. The lands 46a and lands 46b will be cut to the same length, and the test electric terminals 45 will also be cut off at the same time.

The joining step will now be described. In the joining step, the passage unit 1 and the actuator unit 2 will be adhered together in order to produce the head unit 110. Then, the lands 46a of the flexible circuit sheet 40 and the electric terminals 26a of the actuator unit 2, the lands 46b of the flexible circuit sheet 40 and the electric terminals 26b of the actuator unit 2, the lands 47a of the flexible circuit sheet 40 and The ground electric terminals 27a of the actuator unit 2, and the lands 47b of the flexible circuit sheet 40 and The ground electric terminals 27b of the actuator unit 2, will be soldered together. The head 110 and the flexible circuit sheet 40 are electrically joined in order to produce the ink jet head 101.

In the present embodiment, the thickness of the solder adhered to each land 46a, 47a is thinner than the thickness of the solder adhered to each land 46b, 47b. However, the surface area of each land 46a, 47a is larger than each land 46b, 47b. Thus, the quantity of solder adhered to each land 46a, 47a will be approximately the same as the quantity of solder adhered to each land 46b, 47b. Because of that, the lands 46a of the flexible circuit sheet 40 and the electric terminals 26a of the actuator unit 2, the lands 46b of the flexible circuit sheet 40 and the electric terminals 26b of the actuator unit 2, the lands 47a of the flexible circuit sheet 40 and The ground electric terminals 27a of the actuator unit 2, and the lands 47b of the flexible circuit sheet 40 and The ground electric terminals 27b of the actuator unit 2, will be reliably soldered together by substantially the same quantity of solder material.

According to the present embodiment, even if there are times in which the length of the flexible circuit sheet 40 cannot be extended in the X direction, the quantity of solder material adhered to the lands 46a, 47a can be made substantially the same as the quantity of solder material adhered to the lands 46b, 47b. In addition, in the present embodiment the lands 46a are rectangular in shape, and the length of the lands 46a in the Y direction is constant across the entire length in the X direction. When solder is applied in the X direction, solder can be uniformly adhered to the lands 46a The same is true for lands 46b, 47a, 47b. In addition, in the present embodiment, the number of lands 46a and lands 46b are equal, and the number of lands 47a and lands 47b are equal. Thus, the flexible circuit sheet 40 can be joined to the actuator unit 2 with good balance.

(Second Embodiment)

Another preferred embodiment of the present invention will be described. Compared to the first embodiment, in the present embodiment, only the shapes of the electric terminals 26a, 26b, 27a, 27b of the top sheet 23 of the ink jet head 101, and the lands 26a, 26b, 27a, 27b of the flexible circuit sheet 40, will be different. Because of that, only the top sheet 123 and the flexible circuit sheet 140 will be described.

Figure 12:
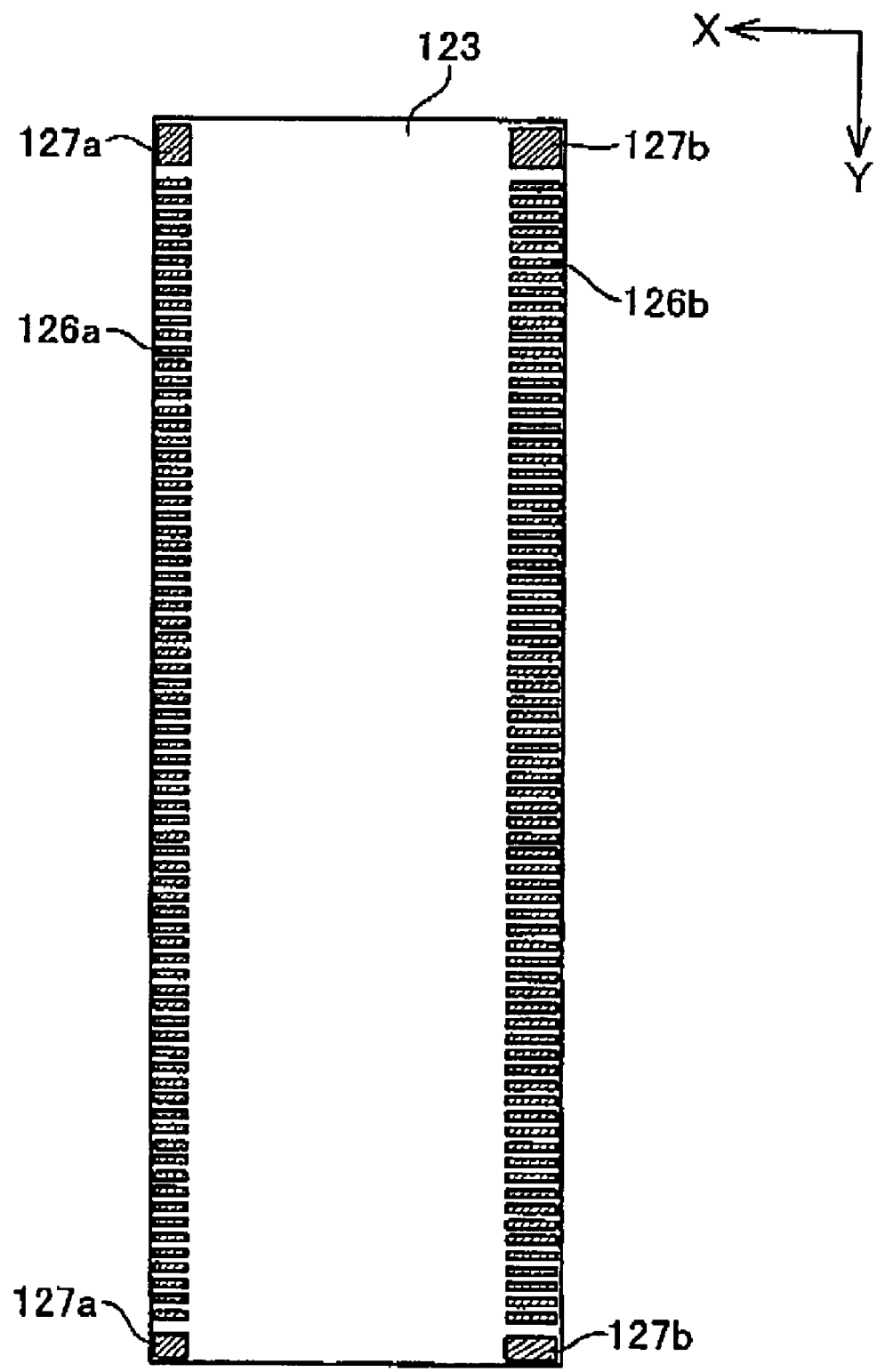
FIG. 12 shows the upper surface of a top sheet of a second embodiment.

The top sheet 123 will now be described. FIG. 12 shows the top sheet 123 from the upper surface thereof. The top sheet 123 is a rectangular sheet, and is formed with an insulator material. The top sheet 123 has electric terminals 126a, 126b that transmit electric signals, and ground electric terminals 127a and 127b. A plurality of electric terminals 126a, 126b are provided on the end portions of the top sheet 123 in the X direction. The length of electric terminals 126a is shorter in the X direction than the electric terminals 126b, and the lengths in the Y direction thereof are equal. In addition, 126a, 126b are rectangular in shape, and the lengths thereof extend in the X direction. Electric signals are supplied from the driver IC 80 to the electric terminals 126a, 126b. The ground electric terminals 127a, 127b are arranged in the corners of the top sheet 123. The length of The ground electric terminals 127a is shorter in the X direction than The ground electric terminals 127b, and the lengths in the Y direction thereof are equal. The ground electric terminals 127a are provided on both sides of the electric terminals 126a in the Y direction. The ground electric terminals 127b are provided on both sides of the electric terminals 126a in the Y direction.

Figure 15:
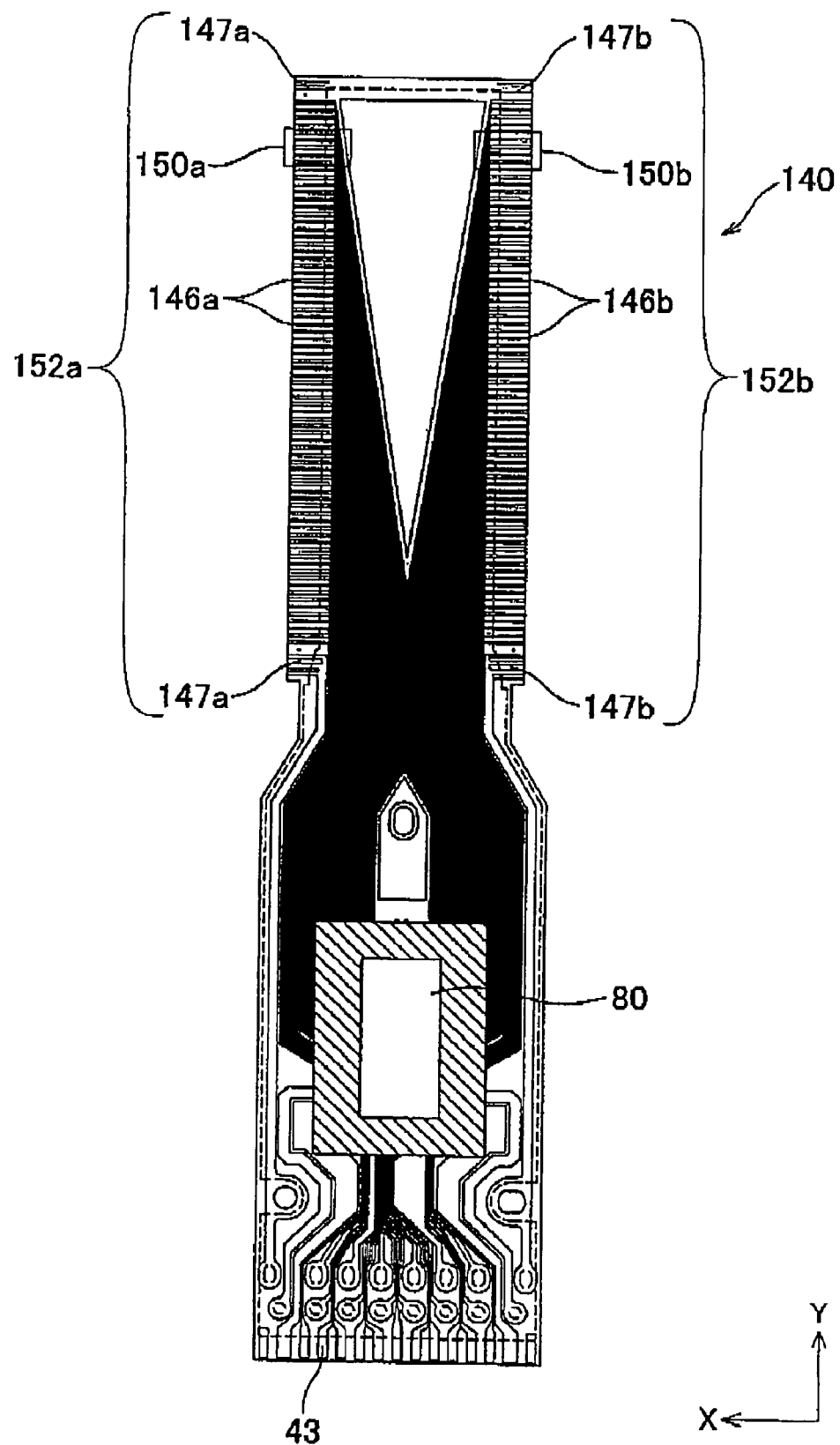
FIG. 15 shows a planar view of a flexible circuit sheet of the second embodiment that is to be joined to the actuator unit.

FIG. 15 shows the flexible circuit sheet 140. A plurality of lands 146a, 146b are formed on approximately the upper half in the Y direction, lands 152a and lands 152b are formed, and are provided on the end portions in the X direction. The lands 146a, 146b are rectangular in shape, and the lengths thereof extend in the X direction. The lands 146a are connected to the electric terminal 126a of the actuator unit 2, and the lands 146b are connected to the electric terminal 126b of the actuator unit 2. The lands 146a, 146b transmit the drive signals transmitted from the driver IC 80 to the electric terminal 126a, 126b of the actuator unit 2. The ground lands 147a are provided on both ends of the lands 146a in the Y direction. The ground lands 147b are provided on both ends of the lands 146b in the Y direction.

Figure 13:
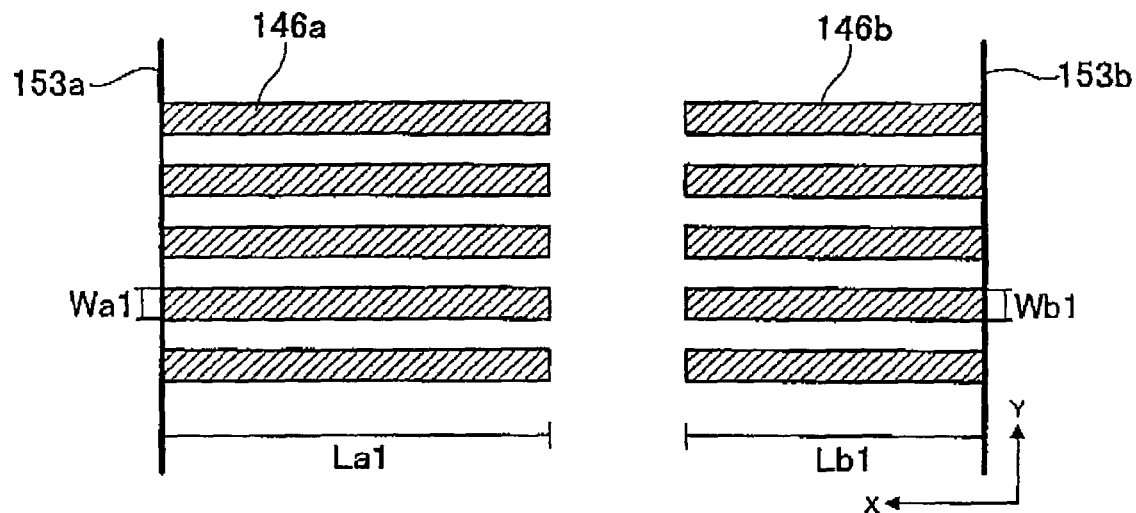
FIG. 13 shows a partial enlarged view of a flexible circuit sheet of the second embodiment.

The rectangular regions 150a, 150b of the flexible circuit sheet 140 will now be described. FIG. 13 shows an enlarged view of the rectangular regions 150a, 150b. The lands 146a and lands 146b are rectangular in shape. The length of the lands 146a in the X direction is longer than the length of the lands 146b in the X direction (La1>Lb1). The length of the lands 146a in the Y direction is equal to the length of the lands 146b in the Y direction. (Wa1=Wb1). As a result, the surface area of the lands 146a is larger than the surface area of the lands 146b.

Figure 14:
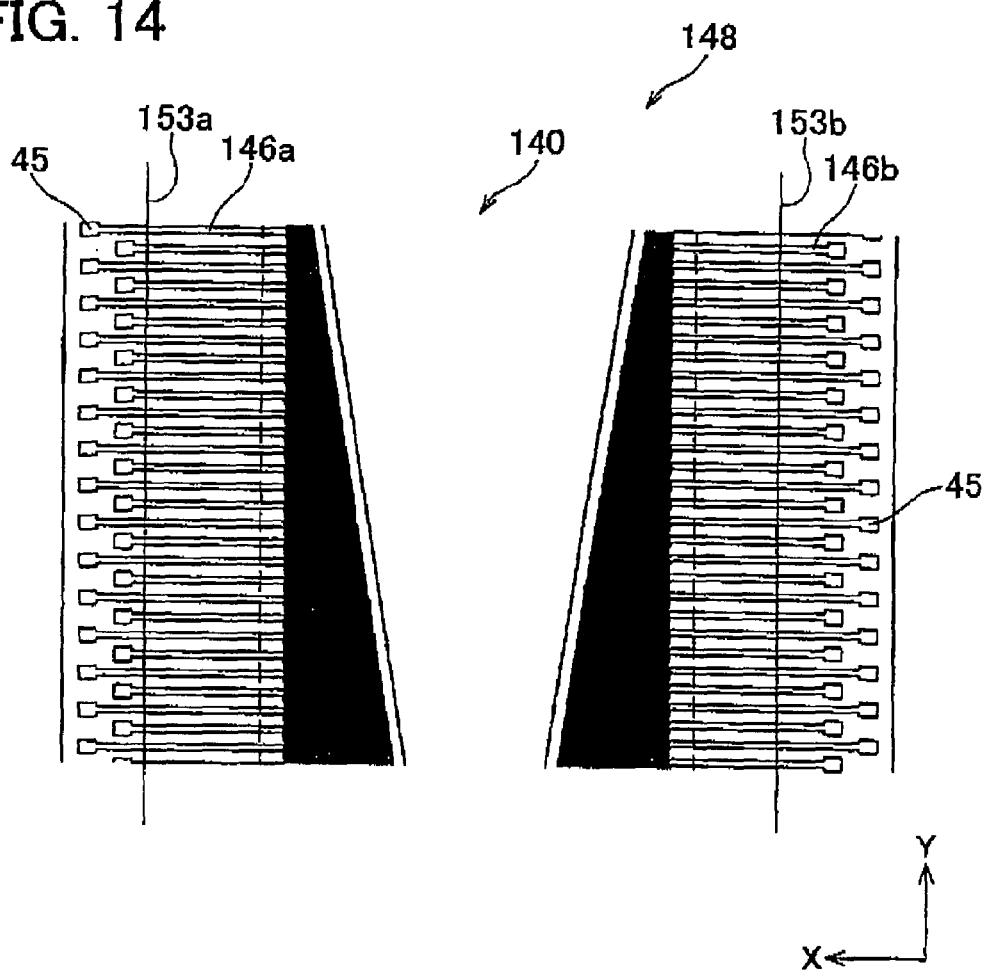
FIG. 14 shows a step of cutting off a plurality of flexible circuit sheets from the continuous tape of FIG. 9.

The flexible circuit sheet 140 will now be described. The flexible circuit sheet 140 has the same shape as the flexible circuit sheet 40, except for the lands 152a, 152b. Only the cut off step of the flexible circuit sheet 140 will be described. The flexible circuit sheet 140 will be cut off from the continuous tape 148. FIG. 14 shows the cut off positions of each land on the flexible circuit sheet 140. Line 153a shows the cut off position of the lands 152a. Line 153b shows the cut off position of the lands 152b. The test lands 45 are also cut off at the same time.

In the present embodiment, the thickness of the solder adhered to each land 146a, 147a is thinner than the thickness of the solder adhered to each land 146b, 147b. However, the surface area of each land 146a, 147a is larger than each land 146b, 147b. Thus, the quantity of solder applied to each land 146a, 147a will be approximately the same as the quantity of solder applied to each land 146b, 147b. Because of that, the lands 146a of the flexible circuit sheet 140 and the electric terminals 126a of the actuator unit 2, the lands 146b of the flexible circuit sheet 140 and the electric terminals 126b of the actuator unit 2, the lands 147a of the flexible circuit sheet 140 and the ground electric terminals 127a of the actuator unit 2, and the lands 147b of the flexible circuit sheet 140 and the ground electric terminals 127b of the actuator unit 2, will be reliably soldered together by substantially the same quantity of solder material.

In addition, in the present embodiment, even if the length of the flexible circuit sheet 140 in the Y direction cannot be extended in the Y direction, the quantity of solder applied to the lands 146a, 147a can be approximately the same as the quantity of solder applied to the lands 146b, 147b.

Furthermore, in the present embodiment, the lands 146a, 147a, 146b, 147b are rectangular in shape. The length of the lands 146a in the Y direction is constant across the entire length in the X direction. Because of this, when solder is to be applied to the lands 146a in the X direction, it can be applied uniformly. The same is true for lands 146b, 147a, 147b. In addition, in the present embodiment, the number of lands 146a and lands 146b are equal, and the number of lands 147a and lands 147b are equal. Thus, the flexible circuit sheet 140 can be joined to the actuator unit 2 with good balance.

(Third Embodiment)

Another preferred embodiment of the present invention will be described. Compared to the first embodiment, only the shapes of the lands 26a, 26b, 27a, 27b of the flexible circuit sheet 40 will be different in the present embodiment. Because of that, only the flexible circuit sheet 240 will be described.

Figure 16:
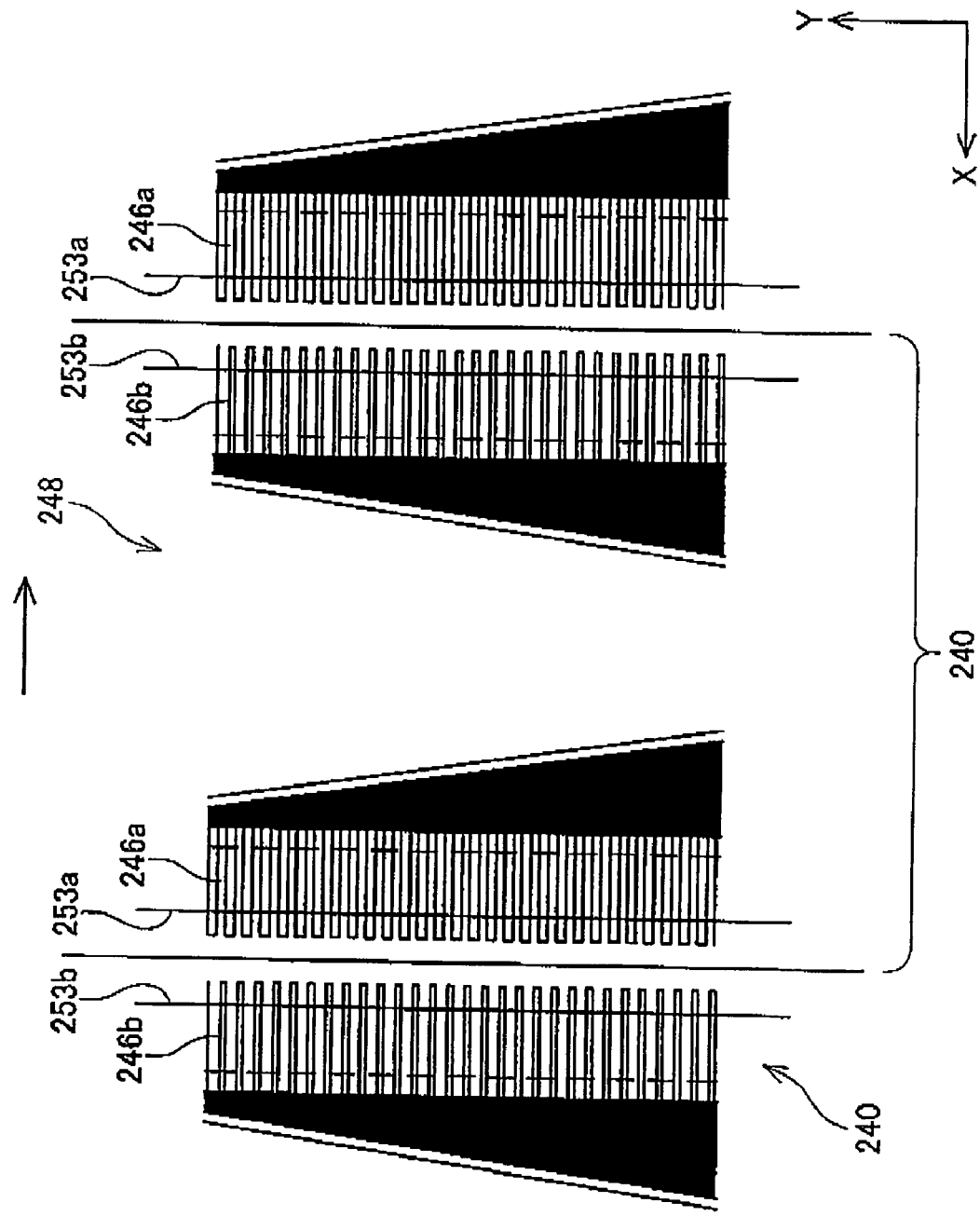
FIG. 16 shows a partial plan view of a flexible circuit sheet of a third embodiment.

FIG. 16 shows the portions of the flexible circuit sheet 240 before cutting. The test electric terminals 45 are not included in the flexible circuit sheet 240 before cutting. Other than that point, the flexible circuit sheet 240 has the same shape as the flexible circuit sheet 40. Each land 246a, 246b of the flexible circuit sheet 240 extend in the X direction, and are rectangular in shape. The length of the lands 246a in the Y direction is longer than the length of the lands 246b in the Y direction. The length of the lands 246a in the X direction is equal to the length of the lands 246b in the X direction. As a result, the surface area of the lands 246a is larger than the surface area of the lands 246b.

The flexible circuit sheet production step includes a continuous tape formation step, an attachment step, a solder material adhering step, and a cut off step.

The continuous tape formation step will now be described. A continuous tape 248 comprises a plurality of flexible circuit sheets 240. The continuous tape 248 is a rectangular polyimide film base sheet, and a conductive pattern and each land are printed thereon. A solder resist is printed on top thereof The attaching step will now be described. In the attaching step, the driver IC 80 will be attached on the flexible circuit sheet 240.

The solder material adhering step will now be described. In the solder material adhering step, solder will be applied to each land on the flexible circuit sheet 240 of the continuous tape 248. FIG. 10 shows the solder material adhering step. Continuous tape 248 wound onto a roll 71 is unwound onto a roll 72. Solder will be applied to each land during this operation. The continuous tape 248 will continue in the direction of the arrow in FIG. 16. Solder will be applied to the lands 246b before the lands 246a. The continuous tape 248 will pass through a flux spray unit 73, a heating unit 74, and a solder bath 75. In the flux spray unit 73, flux will be sprayed on the surface of the continuous tape 248. In the heating unit 74, the surface of the continuous tape 248 will be heated. In the solder bath 75, the continuous tape 248 will be immersed in melted solder.

In the group of lands 246a, the lands 246a are positioned on the forward side in the direction of travel, and the end portions to be cut off are positioned on the rearward side in the direction of travel. In the group of lands 246b, the end portions to be cut off are positioned on the forward side in the direction of travel, and the land electric terminals 246b are positioned on the rearward side in the direction of travel. In the former group of lands 246a, the thickness of the solder adhered to each land 246a will be insufficient after solder flows from the lands 246a on the forward side in the direction of travel to the end portions on the rearward side in the direction of travel. With the latter group of lands 246b, the thickness of the solder adhered to each land 246b will be excessive after solder flows from the end portions to be cut off on the forward side in the direction of travel to the lands 246b on the rearward side in the direction of travel.

The cut off step will now be described. The flexible circuit sheet 240 will be cut off from the continuous tape 248. Line 253a shows the cut off position of the lands 246a. Line 253b shows the cut off position of the lands 246b. The lands 246a and the lands 246b will be cut off at the same length.

In the present embodiment, the thickness of the solder adhered to each land 246a is thinner than the thickness of the solder adhered to each land 246b. However, the surface area of each land 246a is larger than each land 246b. Thus, the quantity of solder applied to each land 246a will be approximately the same as the quantity of solder applied to each land 246b. Because of that, the lands 246a of the flexible circuit sheet 240 and the electric terminals 26a of the actuator 2, and the lands 246b of the flexible circuit sheet 240 and the electric terminals 26b of the actuator 2, will be respectively and reliably soldered together by substantially the same quantity of solder material.

In addition, in the present embodiment, even if the length of the flexible circuit sheet 240 in the X direction cannot be extended in the X direction, the quantity of solder applied to the lands 246a can be approximately the same as the quantity of solder applied to the lands 246b. Furthermore, in the present embodiment, the lands 246a, 246b are rectangular in shape, the length of the lands 146a in the Y direction is constant across the entire length in the X direction, and the length in the Y direction of the lands 146b is constant across the entire length of the X direction. Thus, when solder is applied in the X direction, it can be uniformly applied.

Embodiments were described above, however the present invention is not limited to the aforementioned embodiments. Various improvements and modifications are possible within a range that does not depart from the essence of the present invention.

For example, in each of the aforementioned embodiments, the number of lands 46a and lands 46b are equal, the number of lands 146a and 146b are equal, and the number of lands 246a and 246b are equal, but the number of lands 46a and lands 46b need not be equal, the number of lands 146a and lands 146b need not be equal, and the number of lands 246a and lands 246b need not be equal. In addition, each land 46a and 46b need not be rectangular in shape, and the length of each land 46a and 46b in the Y direction need not be constant across all lengths in the X direction. In addition, each land 146a and 146b need not be rectangular in shape, and the length of each land 146a and 146b in the Y direction need not be constant across all lengths in the X direction. In addition, each land 246a and 246b need not be rectangular in shape, and the length of each land 246a and 246b in the Y direction need not be constant across all lengths in the X direction.

In addition, in the aforementioned first embodiment, the length of the lands 46a in the X direction are equal to the length of the lands 46b in the X direction, and the length of the lands 46a in the Y direction is longer than the length of the lands 46b in the Y direction. Furthermore, in the aforementioned second embodiment, the length of the lands 146a in the X direction are equal to the length of the lands 146b in the X direction, and the length of the lands 146a in the Y direction is longer than the length of the lands 146b in the Y direction. However, the shapes of the lands is not limited to the aforementioned shapes, and the surface area of each land of the lands 52*a* or lands 152*a* maybe larger than each land of the lands 52*b* or the lands 152*b*. For example, each land of the lands 52*a* or the lands 152*a* may be longer in the X direction, and longer in the Y direction than each land of the lands 52*b* or the lands 152*b*.

In addition, in the aforementioned first embodiment, when the flexible circuit sheet 40 is cut off from the continuous tape 48 in the cut off step, each land 46*a*, 46*b*, 47*a*, 47*b* are cut off at the same time. However, the step in which the flexible circuit sheet 40 is cut off from the continuous tape 48, and the step in which each land 46*a*, 46*b*, 47*a*, 47*b* are cut off from the flexible circuit sheet 40, need not be performed simultaneously.

Furthermore, in each of the aforementioned embodiments, the flexible circuit sheet 40, or the flexible circuit sheet 140, or the flexible circuit sheet 240 are of a type that applies electric signals to the actuator unit 2, however a type that applies heat energy to ink inside pressure chambers is also possible. For example, ink may be jetted by a method in which the flexible circuit sheet 40, or the flexible circuit sheet 140, or the flexible circuit sheet 24 apply heat energy to pressure chambers and heating the ink.

Moreover, in each of the aforementioned embodiments, the flexible circuit sheet 40, or the flexible circuit sheet 140, or the flexible circuit sheet 240 is employed, however, the flexible circuit sheets may also be employed on something other than an ink jet head.

Moreover, in each of the aforementioned embodiments, the electric terminal 26 disposed on top of actuator unit 2 and the lands disposed on top of the flexible circuit sheet 40 and 140 are attached together by soldering. However, the invention is not limited to this, and other electrically conductive materials such as conductive adhesive may be used to attach the terminal and lands together.

What is claimed is:

1. A flexible circuit sheet to be electrically connected to an electric device having a first row of electric terminals and a second row of electric terminals, the second row of electric terminals extending parallel to the first row of electric terminals, wherein the flexible circuit sheet comprises:
    a base sheet;
    a first row of lands to be electrically connected to the first row of electric terminals, the first row of lands being formed on the base sheet; and
    a second row of lands to be electrically connected to the second row of electric terminals, the second row of lands being formed on the base sheet,
    wherein a positional relationship between the first row of lands and the second row of lands is equal to a positional relationship between the first row of electric terminals and the second row of electric terminals, and
    wherein a surface area of each land of the first row of lands is greater than a surface area of each land of the second row of lands.

2. The flexible circuit sheet as defined in claim 1, further comprising:
    a first set of electric wirings formed on the base sheet; and
    a second set of electric wirings formed on the base sheet,
    wherein each land of the first row of lands is connected to one corresponding electric wiring of the first set of electric wirings, and each land of the second row of lands is connected to one corresponding electric wiring of the second set of electric wirings.

3. The flexible circuit sheet as defined in claim 1, wherein a number of lands in the first row of lands is equal to a number of lands in the second row of lands.

4. The flexible circuit sheet as defined in claim 1, wherein each land of the first row of lands extends by a first distance along a first direction in which the first and second rows of lands extend;
    each land of the second row of lands extends by a second distance along the first direction; and the first distance is longer than the second distance.

5. The flexible circuit sheet as defined in claim 1, wherein each land of the first row of lands extends by a third distance along a second direction that is perpendicular to a direction in which the first and second rows of lands extend;
    each land of the second row of lands extends by a fourth distance along the second direction; and the third distance is longer than the fourth distance.

6. The flexible circuit sheet as defined in claim 1, wherein each land of the first row of lands has a rectangular shape extending by a first distance along a first direction in which the first and second rows of lands extend and extending by a third distance along a second direction which is perpendicular to the first direction; and
    each land of the second row of lands has a rectangular shape extending by a second distance along the first direction and extending by a fourth distance along the second direction.

7. The flexible circuit sheet as defined in claim 6, wherein the first distance is longer than the second distance, and/or the third distance is longer than the fourth distance.

8. A continuous flexible tape extending in a second direction, comprising:
    a plurality of flexible circuit sheets to be electrically connected to a plurality of electric devices, each electric device having a first row of electric terminals extending in a first direction which is perpendicular to the second direction and a second row of electric terminals extending parallel to the first row of electric terminals, and another flexible circuit sheet being connected to each flexible circuit sheet along the second direction,
    wherein each flexible circuit sheet comprises:
        a base sheet;
        a first row of lands to be electrically connected to the first row of electric terminals, wherein the first row of lands is formed on the base sheet and extends in the first direction; and
        a second row of lands to be electrically connected to the second row of electric terminals, wherein the second row of lands is formed on the base sheet and extends parallel to the first row of lands,
    wherein a surface area of each land of the first row of lands is greater than a surface area of each land of the second row of lands.

9. An ink jet head comprising:
    an ink jet head body having a plurality of pressure chambers, each pressure chamber being connected to one corresponding nozzle;
    an actuator unit fixed to the ink jet head body, wherein the actuator unit has a plurality of actuators and a plurality of electric terminals, each electric terminal being connected to one corresponding actuator and each actuator being coupled with one corresponding pressure chamber, wherein a pressure within the corresponding pressure chamber can be increased when the actuator is activated, and wherein the electric terminals are classified into a first row of electric terminals and a second row of electric terminals, the second row of electric terminals extending parallel to the first row of electric terminals; and a flexible circuit sheet electrically connected to the actuator unit, the flexible circuit sheet comprising:
a base sheet;
a first row of lands electrically connected to the first row of electric terminals, the first row of lands being formed on the base sheet; and
a second row of lands electrically connected to the second row of electric terminals, the second row of lands being formed on the base sheet;
wherein a surface area of each land of the first row of lands is greater than a surface area of each land of the second row of lands.

10. A method of producing an ink jet head, the ink jet head comprising:

an actuator unit having a plurality of electric terminals classified into a first row of electric terminals extending in a first direction and a second row of electric terminals extending in the first direction, wherein the second row of electric terminals is separated from the fist row of electric terminals in a second direction which is perpendicular to the first direction; and a flexible circuit sheet electrically connected to the actuator unit, the flexible circuit sheet comprising a first row of lands electrically connected to the first row of electric terminals and a second row of lands electrically connected to the second row of electric terminals;

the method comprising:

producing a continuous tape extending in the second direction, wherein the continuous tape comprises a plurality of flexible circuit sheets, each flexible circuit sheet comprising a first row of lands to be electrically connected to the first row of electric terminals and a second row of lands to be electrically connected to the second row of electric terminals, wherein the first row of lands extend in the first direction and the second row of lands extend parallel to the first row of lands, wherein a surface area of each land of the first row of lands is greater than a surface area of each land of the second row of lands;

applying electrically conductive material to each land by moving the continuous tape along the second direction across a bath that contains fluid of electrically conductive material, wherein the second row of lands is soaked in a bath that contains fluid of electrically conductive material before the first row of lands;

cutting the continuous tape into the plurality of flexible circuit sheets; and attaching the first row of lands to the first row of electric terminals and attaching the second row of lands to the second row of electric terminals.

11. The method of claim 10, wherein the flexible circuit sheet in the step of producing the continuous tape comprises a first row of test terminals and a second row of test terminals, each test terminal of the first row of test terminals being connected to one corresponding land of the first row of lands, and each test terminal of the second row of test terminals being connected to one corresponding land of the second row of lands; and the step of cutting the continuous tape into a plurality of flexible circuit sheets further comprises cutting off the portion between the first row of lands and the first row of test terminals, and cutting off the portion between the second row of lands and the second row of test terminals.

* * * * *